(12) United States Patent
Yao et al.

(10) Patent No.: US 11,842,966 B2
(45) Date of Patent: Dec. 12, 2023

(54) INTEGRATED CHIP WITH INTER-WIRE CAVITIES

(71) Applicant: Taiwan Semiconductor Manufacturing Company, Ltd., Hsinchu (TW)

(72) Inventors: Hsin-Chieh Yao, Hsinchu (TW); Chung-Ju Lee, Hsinchu (TW); Chih Wei Lu, Hsinchu (TW); Hsi-Wen Tien, Xinfeng Township (TW); Wei-Hao Liao, Taichung (TW); Yu-Teng Dai, New Taipei (TW); Hsin-Yen Huang, New Taipei (TW); Chia-Tien Wu, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 78 days.

(21) Appl. No.: 17/355,613

(22) Filed: Jun. 23, 2021

(65) Prior Publication Data
US 2022/0415804 A1    Dec. 29, 2022

(51) Int. Cl.
| H01L 23/538 | (2006.01) |
| H01L 21/768 | (2006.01) |
| H01L 21/48  | (2006.01) |
| H01L 23/532 | (2006.01) |

(52) U.S. Cl.
CPC ........ *H01L 23/5384* (2013.01); *H01L 21/486* (2013.01); *H01L 21/7682* (2013.01); *H01L 21/76802* (2013.01); *H01L 23/5329* (2013.01); *H01L 23/5386* (2013.01)

(58) Field of Classification Search
CPC ............ H01L 21/7682; H01L 23/5329–53295
See application file for complete search history.

(56) References Cited

U.S. PATENT DOCUMENTS

| 6,287,979 | B1 | 9/2001 | Zhou |
| 7,329,613 | B2 | 2/2008 | Furukawa |
| 9,281,277 | B2 | 3/2016 | Baek |
| 9,390,965 | B2 | 7/2016 | Yang et al. |
| 2008/0182403 | A1 | 7/2008 | Noori |

(Continued)

OTHER PUBLICATIONS

Non-Final Office Action dated Aug. 25, 2021 in connection with U.S. Appl. No. 16/923,424.
Mackus et al. "From the Bottom-Up: Toward Area-Selective Atomic Layer Deposition with High Selectivity.".

(Continued)

*Primary Examiner* — Selim U Ahmed
*Assistant Examiner* — Evan G Clinton
(74) *Attorney, Agent, or Firm* — Eschweiler & Potashnik, LLC

(57) ABSTRACT

The present disclosure relates to an integrated chip comprising a substrate. A first conductive wire is over the substrate. A second conductive wire is over the substrate and is adjacent to the first conductive wire. A first dielectric cap is laterally between the first conductive wire and the second conductive wire. The first dielectric cap laterally separates the first conductive wire from the second conductive wire. The first dielectric cap includes a first dielectric material. A first cavity is directly below the first dielectric cap and is laterally between the first conductive wire and the second conductive wire. The first cavity is defined by one or more surfaces of the first dielectric cap.

20 Claims, 13 Drawing Sheets

(56) References Cited

U.S. PATENT DOCUMENTS

| | | |
|---|---|---|
| 2009/0093100 A1 | 4/2009 | Xia |
| 2009/0302475 A1 | 12/2009 | Korogi |
| 2010/0001409 A1 | 1/2010 | Humbert |
| 2010/0093168 A1 | 4/2010 | Naik |
| 2012/0261788 A1 | 10/2012 | Lin |
| 2015/0179582 A1 | 6/2015 | Baek |
| 2015/0287682 A1 | 10/2015 | Ahn |
| 2016/0293547 A1* | 10/2016 | Rha .................... H01L 23/5222 |
| 2016/0379871 A1 | 12/2016 | Tsai et al. |
| 2017/0186683 A1* | 6/2017 | Lin .................. H01L 23/53228 |
| 2017/0278796 A1 | 9/2017 | Briggs |
| 2020/0006228 A1* | 1/2020 | Yang ................ H01L 21/76832 |
| 2020/0258772 A1 | 8/2020 | Hsieh |
| 2020/0411427 A1 | 12/2020 | Lin |
| 2021/0043498 A1 | 2/2021 | Lai |
| 2021/0066187 A1* | 3/2021 | Lee .................. H01L 23/53295 |
| 2021/0225691 A1* | 7/2021 | Cheng .............. H01L 21/76897 |

OTHER PUBLICATIONS

Lapedus, Mark. "Where Is Selective Deposition?" Semiconductor Engineering, published on Jun. 25, 2018. Chem. Mater. 2019, 31, 2-12, published on Dec. 19, 2018.

Stine et al. "Formation of Primary Amines on Silicon Nitride Surfaces: A Direct, Plasma-Based Pathway to Functionalization." Langmuir 2007, 23, 4400-4404, published Feb. 27, 2007.

Raphael et al. "Surface Modification and Grafting of Carbon Fibers: A Route to Better Interface." Progress in Crystal Growth and Characterization of Materials 64 (2018) 75-101, published Jul. 25, 2018.

U.S. Appl. No. 16/898,705, filed Jun. 11, 2020.

U.S. Appl. No. 17/236,234, filed Apr. 21, 2021.

U.S. Appl. No. 16/923,424, filed Jul. 8, 2020.

Non-Final Office Action dated Aug. 27, 2021 in connection with U.S. Appl. No. 16/898,705.

Notice of Allowance dated Dec. 9, 2021 in connection with U.S. Appl. No. 16/898,705.

* cited by examiner

INTEGRATED CHIP WITH INTER-WIRE CAVITIES

BACKGROUND

Modern day integrated chips contain millions of semiconductor devices. The semiconductor devices are electrically interconnected by way of back-end-of-the-line (BEOL) metal interconnect layers that are formed above the devices. A typical integrated chip comprises a plurality of BEOL metal interconnect layers including different sized metal wires vertically coupled together with metal vias.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
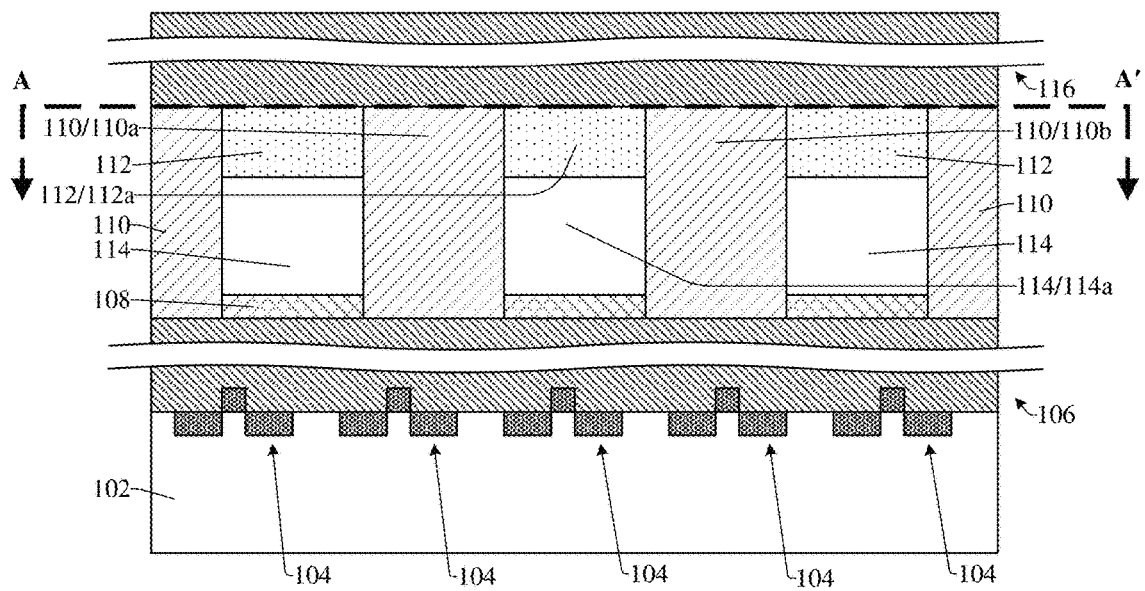
FIG. 1A illustrates a cross-sectional view of some embodiments of an integrated chip comprising a first metal wire and a second metal wire that are laterally separated by a first cavity.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated chips include one or more semiconductor devices along a substrate and a plurality of metal wires over the substrate that may be electrically connected to the one or more semiconductor devices. The plurality of metal wires are laterally separated from one another by a dielectric layer. The dielectric layer may, for example, comprise silicon oxide, silicon nitride, or some other suitable dielectric.

A challenge with these integrated chips is that a capacitance that exists between the plurality of metal wires contributes to a resistive-capacitive (RC) delay in the integrated chip. The capacitance is proportional to a dielectric constant of the dielectric layer that separates the metal wires. Thus, metal wires that are separated by a material having a high dielectric constant (e.g., about 3.9 for silicon oxide) may exhibit a high capacitance and hence a high RC delay. As a result, a performance of the integrated chip may be low.

Various embodiments of the present disclosure are related to an integrated chip comprising one or more cavities for improving a performance of the integrate chip, and a method of forming the integrated chip for improving a reliability of the integrated chip. For example, an integrated chip comprises an etch-stop layer over a substrate. A first metal wire and a second metal wire are over the etch-stop layer and the second metal wire is laterally adjacent to the first metal wire. The etch-stop layer laterally separates the first metal wire from the second metal wire. A first dielectric cap is directly over the etch-stop layer and laterally between the first metal wire and the second metal wire. A first cavity is directly below the first dielectric cap and directly over the etch-stop layer. The first cavity laterally separates the first metal wire from the second metal wire. Further, the first cavity comprises a first gas and the first cavity is defined by one or more surfaces of the first dielectric cap.

The first gas may, for example, comprise air or some other suitable gas(es) and hence may have a low dielectric constant (e.g., about 1 for air). Thus, by including the first cavity in the integrated chip between the first and second metal wires, a dielectric constant between the first and second metal wires may be low. As a result, a capacitance between the first and second metal wires may also be low and hence an RC delay of the integrated chip may be reduced. Thus, a performance of the integrated chip may be improved.

Further, a method for forming the first cavity may prevent causing damage to the first metal wire and the second metal wire throughout the method. In various embodiments, the method comprises forming a first capping structure over the first metal wire and a second capping structure over the second metal wire before removing a first dielectric structure from between the first and second metal wires with an etch. The first and second capping structures may protect the underlying first and second metal wires from being damaged by the etch. Thus, the first and second metal wires may be undamaged after forming the first cavity. For example, sidewalls and top surfaces of the first and second metal wire may be substantially planar and/or devoid of nanoscopic voids after the first cavity is formed. As a result, a structural integrity of the first and second metal wires may be maintained and hence a reliability of the first and second metal wires may be high.

Figure 1B:
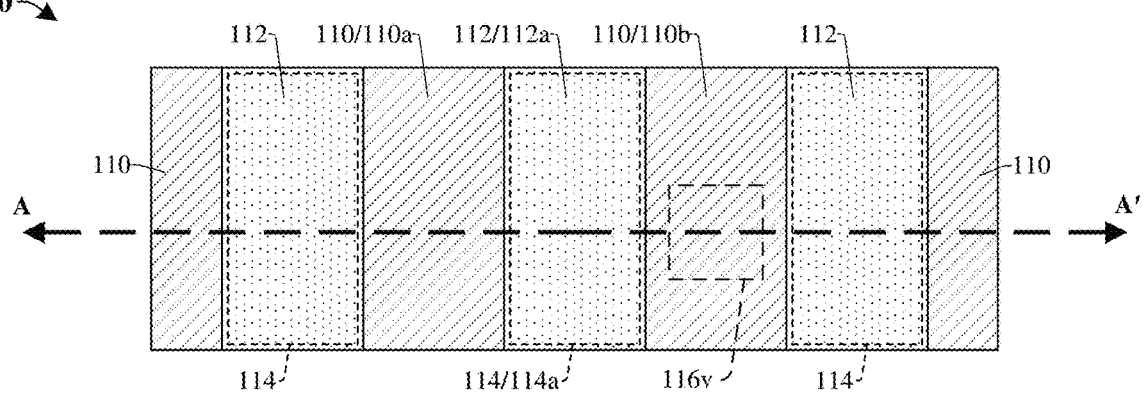
FIG. 1B illustrates a top view of some embodiments of the integrated chip of FIG. 1A.

Referring to FIGS. 1A and 1B simultaneously, FIG. 1A illustrates a cross-sectional view 100 of some embodiments of an integrated chip comprising a first metal wire 110a and a second metal wire 110b that are laterally separated by a first cavity 114a, while FIG. 1B illustrates a top view 150 of some embodiments of the integrated chip of FIG. 1A. The cross-sectional view 100 of FIG. 1A may, for example, be taken across line A-A' of FIG. 1B.

In such embodiments, the integrated chip comprises a plurality of semiconductor devices 104 along a substrate 102. A first interconnect structure 106 is over the substrate 102. Further, a first etch-stop layer 108 extends over the first interconnect structure 106. Furthermore, a plurality of metal wires 110, a plurality of dielectric caps 112, and a plurality of cavities 114 extend over the first interconnect structure 106.

For example, the first metal wire 110a and the second metal wire 110b of the plurality of metal wires 110 extend over the first interconnect structure 106. The first metal wire 110a is laterally adjacent to the second metal wire 110b. A first dielectric cap 112a of the plurality of dielectric caps 112 is directly over the first etch-stop layer 108 and is laterally between the first metal wire 110a and the second metal wire 110b. The first dielectric cap 112a laterally separates the first metal wire 110a from the second metal wire 110b along tops of the first and second metal wires 110a, 110b. In addition, the first etch-stop layer 108 laterally separates the first metal wire 110a from the second metal wire 110b along bottoms of the first and second metal wires 110a, 110b.

In some embodiments, top surfaces of the plurality of metal wires 110 are substantially planar (e.g., the first and second top surfaces may not deviate from their respective planes by more than about 1 nanometer, more than about 5 nanometers, more than about 10 nanometers, or some other suitable value). For example, in some embodiments, a first top surface of the first metal wire 110a and a second top surface of the second metal wire 110b are substantially planar. Further, in some embodiments, sidewalls of the plurality of metal wires 110 are also substantially planar. For example, in some embodiments, a first sidewall of the first metal wire 110a and a second sidewall of the second metal wire 110b that faces the first sidewall are substantially planar.

In some embodiments, sidewalls and top surfaces of the first metal wire 110a and the second metal wire 110b are devoid of nanoscopic voids (e.g., nanoscopic defects). For example, in such embodiments, the sidewalls and the top surfaces of the first metal wire 110a and the second metal wire 110b are devoid of voids and/or defects that are greater than about 5 angstroms in width, greater than about 1 nanometer in width, greater than about 5 nanometers in width, or some other suitable value.

In some embodiments, the first and second metal wires 110a, 110b have first and second theoretical sheet resistances, respectively, and have first and second measured sheet resistances, respectively. In such embodiments, the first measured sheet resistance may differ from the first theoretical sheet resistance by less than 1 percent, less than 5 percent, less than 10 percent, less than 20 percent, less than 30 percent, or some other suitable value. Likewise, the second measured sheet resistance may differ from the second theoretical sheet resistance by less than 1 percent, less than 5 percent, less than 10 percent, less than 20 percent, less than 30 percent, or some other suitable value.

In some embodiments, the first and second metal wires 110a, 110b may have any of the aforementioned characteristics (e.g., planar surfaces, surfaces devoid of nanoscopic voids, and/or small differences in measured and theoretical sheet resistances, etc.) because a method for forming the integrated chip may prevent causing damage to the first metal wire 110a and the second metal wire 110b throughout the method.

Further, the first cavity 114a of the plurality of cavities 114 is directly below the first dielectric cap 112a and is directly over the first etch-stop layer 108. The first cavity 114a laterally separates the first metal wire 110a from the second metal wire 110b. The first cavity 114a is defined by one or more surfaces of the first dielectric cap 112a and the first cavity 114a comprises a first gas. In some embodiments, the first gas may, for example, be or comprise air, some other suitable gas having a low dielectric constant, or the like.

In some embodiments, the first cavity 114a is defined by an upper surface of the first etch-stop layer 108, a sidewall of the first metal wire 110a, a sidewall of the second metal wire 110b, and a lower surface of the first dielectric cap 112a. In some embodiments, the lower surface of the first dielectric cap 112a defines a top of the first cavity 114a. Further, the lower surface of the first dielectric cap 112a is below a top surface of the first metal wire 110a and below a top surface of the second metal wire 110b. In some embodiments, a width of the first cavity 114a is approximately equal to a distance between the first metal wire 110a and the second metal wire 110b.

By including the first cavity 114a in the integrated chip between the first metal wire 110a and the second metal wire 110b, a dielectric constant between the first and second metal wires 110a, 110b may be low. As a result, a capacitance between the first and second metal wires 110a, 110b may also be low and hence an RC delay of the integrated chip may be reduced. Thus, a performance of the integrated chip may be improved.

In some embodiments, the integrated chip further comprises a second interconnect structure 116 over the plurality of metal wires 110.

Although the first interconnect structure 106 and the second interconnect structure 116 are illustrated generically in FIG. 1, it will be appreciated that the first interconnect structure 106 and the second interconnect structure 116 may each comprise one or more levels of interconnect. For example, the first interconnect structure 106 and/or the second interconnect structure 116 may comprise one or more etch-stop layers, one or more dielectric layers, one or more metal wires, one or more metal vias, one or more contacts, some other suitable interconnect features, or any combination of the foregoing.

In some embodiments, the substrate 102 may, for example, comprise silicon, some III-V material, some other semiconductor material, or the like.

In some embodiments, the plurality of semiconductor devices 104 may, for example, be or comprise metal-oxide-semiconductor field-effect transistors (MOSFETs), bipolar junction transistors (BJTs), junction field-effect transistors (JFETs), fin field-effect transistors (FinFETs), gate-all-around field-effect transistors (GAA FETs), some other suitable semiconductor device(s), or the like.

In some embodiments, the plurality of dielectric caps 112 may, for example, comprise any of silicon oxide, silicon nitride, silicon oxynitride, silicon carbide, silicon oxycarbide, silicon carbonitride, silicon oxycarbonitride, some other low-k dielectric (e.g., having a dielectric constant of less than about 3.9), some other extreme low-k dielectric (e.g., having a dielectric constant of less than about 2), or some other suitable dielectric.

In some embodiments, the first etch-stop layer 108 may, for example, comprise any of silicon oxide, silicon nitride, silicon oxynitride, silicon carbide, silicon oxycarbide, silicon carbonitride, silicon oxycarbonitride, aluminum oxide, aluminum oxynitride, or some other suitable dielectric.

In some embodiments, the plurality of metal wires 110 may, for example, comprise any of tantalum, tantalum nitride, titanium nitride, copper, cobalt, ruthenium, molybdenum, iridium, tungsten, some other conductive material, or some other suitable material.

Figure 2:
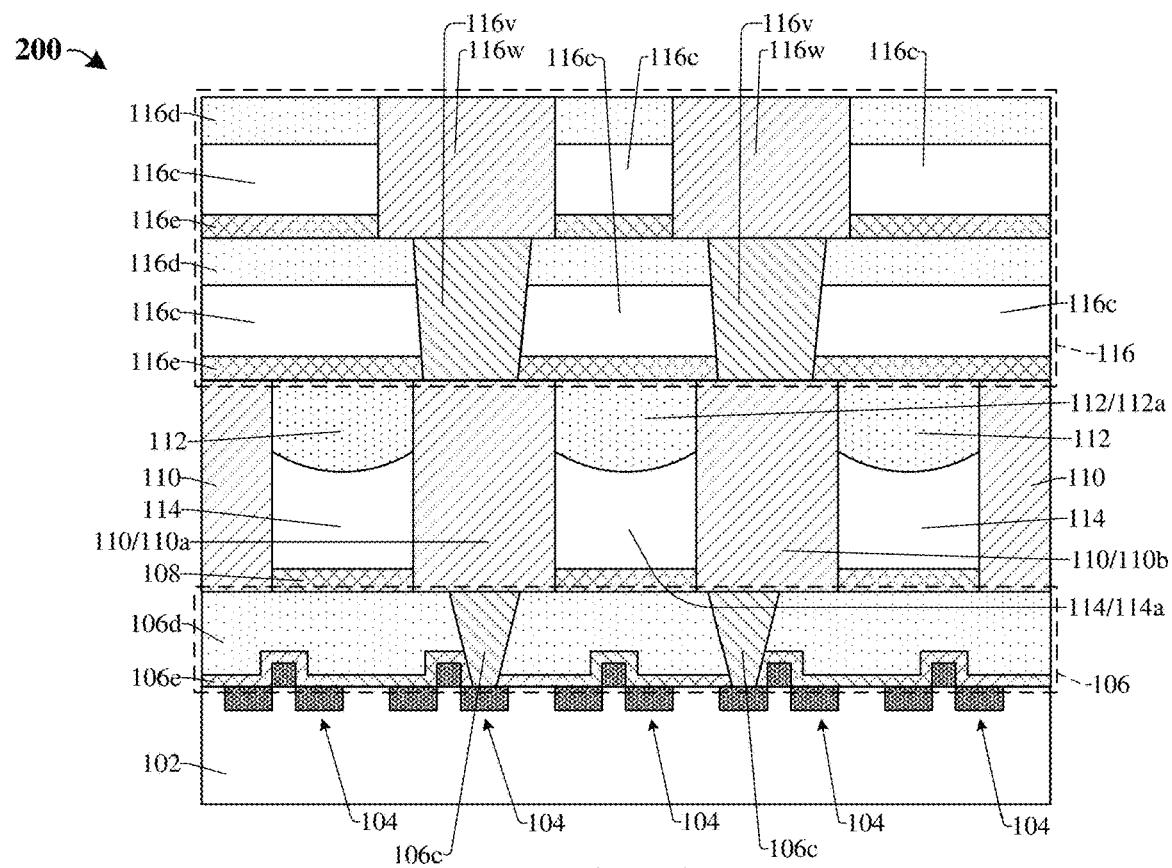
FIG. 2 illustrates a cross-sectional view of some alternative embodiments of the integrated chip of FIG. 1A in which a first dielectric cap over the first cavity has a curved lower surface.

FIG. 2 illustrates a cross-sectional view 200 of some alternative embodiments of the integrated chip of FIG. 1A in which the first dielectric cap 112a over the first cavity 114a has a curved lower surface.

In such embodiments, the plurality of dielectric caps 112 have curved (e.g., convex) lower surfaces that define tops of the plurality of cavities 114. For example, a bottom of the first dielectric cap 112a is below a first point where the first dielectric cap 112a meets the first metal wire 110a and below a second point where the first dielectric cap 112a meets the second metal wire 110b.

The plurality of dielectric caps 112 may have curved lower surfaces due to a sacrificial layer (e.g., 1402 of FIG. 14) being recessed to form a plurality of sacrificial structures (e.g., 1502 of FIG. 15), where the recessing results in the plurality of sacrificial structures having curved upper surfaces (e.g., 1502u of FIG. 15), and due to a dielectric layer (e.g., 1602 of FIG. 16) being subsequently deposited over the plurality of sacrificial structures.

Further, in some embodiments, the first interconnect structure 106 may, for example, comprise a lower etch-stop layer 106e, a lower dielectric layer 106d, and one or more contacts 106c. In some embodiments, other interconnect levels and/or features may also be included.

Furthermore, in some embodiments, the second interconnect structure 116 may, for example, comprise one or more upper etch-stop layers 116e, one or more upper dielectric layers 116d, one or more upper vias 116v, one or more upper metal wires 116w, one or more upper cavities 116c, or some other suitable features (e.g., bond pads, solder bumps, etc.). For example, in such embodiments, the one or more upper vias 116v may be separated by the upper cavities 116c. Further, the one or more upper metal wires 116w may be over the one or more upper vias 116v and also may be separated by the upper cavities 116c. In some embodiments, other interconnect levels and/or features may also be included.

In some embodiments, any of the lower dielectric layer 106d and the one or more upper dielectric layers 116d may, for example, comprise any of silicon oxide, silicon nitride, silicon oxynitride, silicon carbide, silicon oxycarbide, silicon carbonitride, silicon oxycarbonitride, some other low-k dielectric (e.g., having a dielectric constant of less than about 3.9), some other extreme low-k dielectric (e.g., having a dielectric constant of less than about 2), or some other suitable dielectric.

In some embodiments, any of the lower etch-stop layer 106e and the one or more upper etch-stop layers 116e may, for example, comprise any of silicon oxide, silicon nitride, silicon oxynitride, silicon carbide, silicon oxycarbide, silicon carbonitride, silicon oxycarbonitride, aluminum oxide, aluminum oxynitride, or some other suitable dielectric.

In some embodiments, the one or more contacts 106c may, for example, comprise tungsten, copper, aluminum, titanium, tantalum, or some other suitable material.

In some embodiments, any of the one or more upper vias 116v and the one or more upper metal wires 116w may, for example, comprise any of tantalum, tantalum nitride, titanium nitride, copper, cobalt, ruthenium, molybdenum, iridium, tungsten, some other conductive material, or some other suitable material.

In some embodiments, the one or more upper cavities 116c may, for example, comprise air, nitrogen, oxygen, carbon dioxide, some other suitable gas having a low dielectric constant, or any combination of the foregoing.

Figure 3:
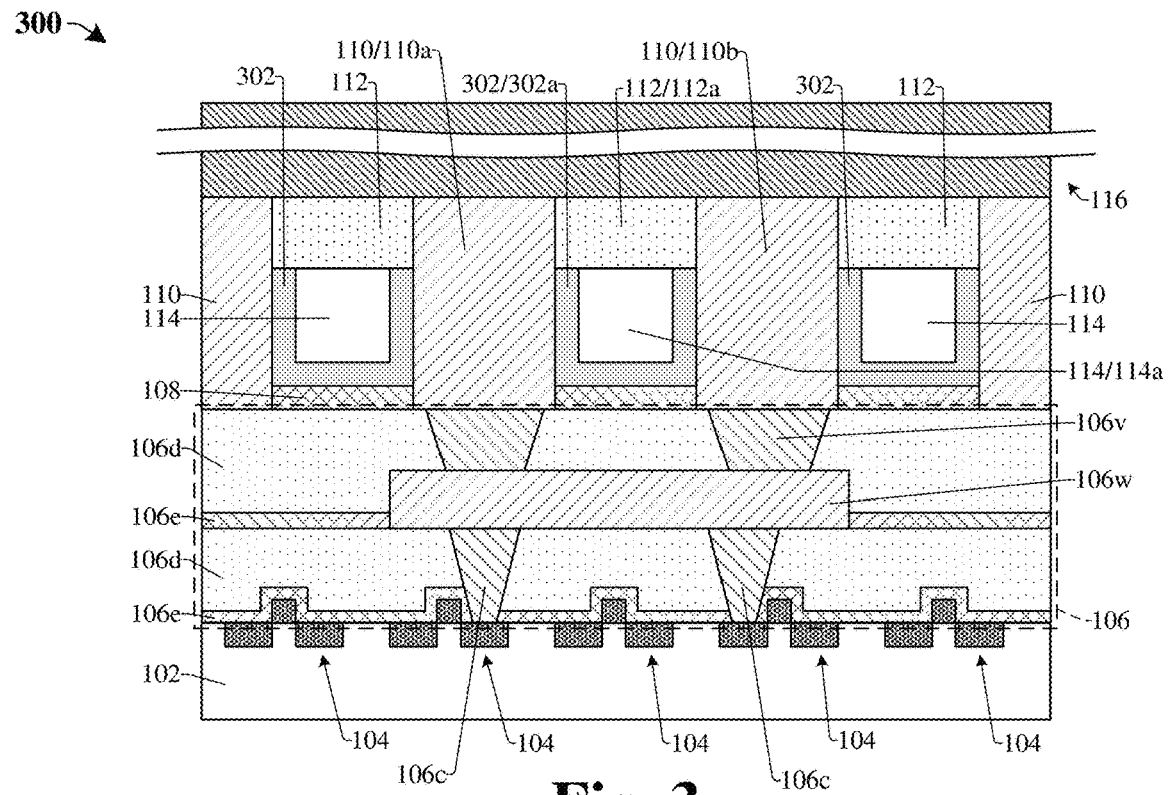
FIG. 3 illustrates a cross-sectional view of some alternative embodiments of the integrated chip of FIG. 1A in which the first cavity is defined by one or more surfaces of a first residual sacrificial structure.

FIG. 3 illustrates a cross-sectional view 300 of some alternative embodiments of the integrated chip of FIG. 1A in which the first cavity 114a is defined by one or more surfaces of a first residual sacrificial structure 302a.

In such embodiments, the plurality of cavities 114 are defined by one or more surfaces of a plurality of residual sacrificial structures 302. For example, the first residual sacrificial structure 302a of the plurality of residual sacrificial structures 302 defines, at least in part, the first cavity 114a of the plurality of cavities 114. The first residual sacrificial structure 302a may, for example, be disposed on any of an upper surface of the first etch-stop layer 108, a sidewall of the first metal wire 110a, a sidewall of the second metal wire 110b, and a lower surface of the first dielectric cap 112a.

In some embodiments (not shown), the first residual sacrificial structure 302a is on all of the aforementioned surfaces such that the first cavity 114a is enclosed by the first residual sacrificial structure 302a. In some other embodiments, the first residual sacrificial structure 302a is only on some of the aforementioned surfaces such that the first residual sacrificial structure 302a only partially defines the first cavity 114a. For example, the first residual sacrificial structure 302a may be on the upper surface of the first etch-stop layer 108 and on sidewalls of the first and second metal wires 110a, 110b such that a bottom of the first cavity 114a is defined by an upper surface of the first residual sacrificial structure 302a while a top of the first cavity 114a is defined by a lower surface of the first dielectric cap 112a.

Figure 15:
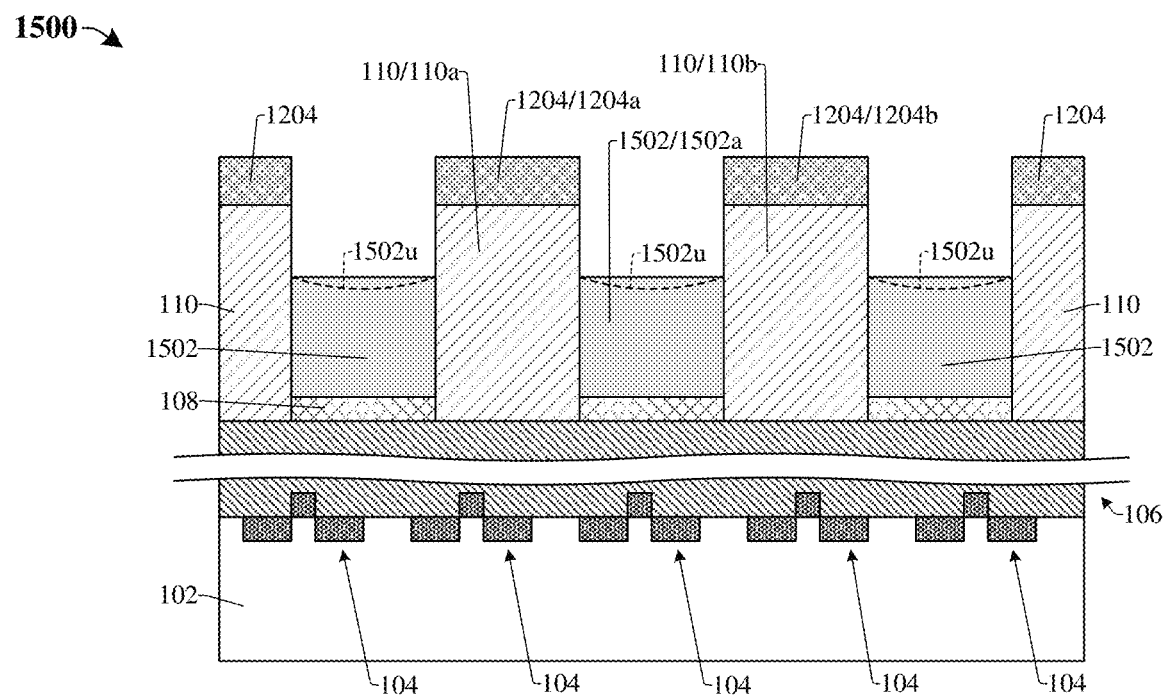
Figure 16:
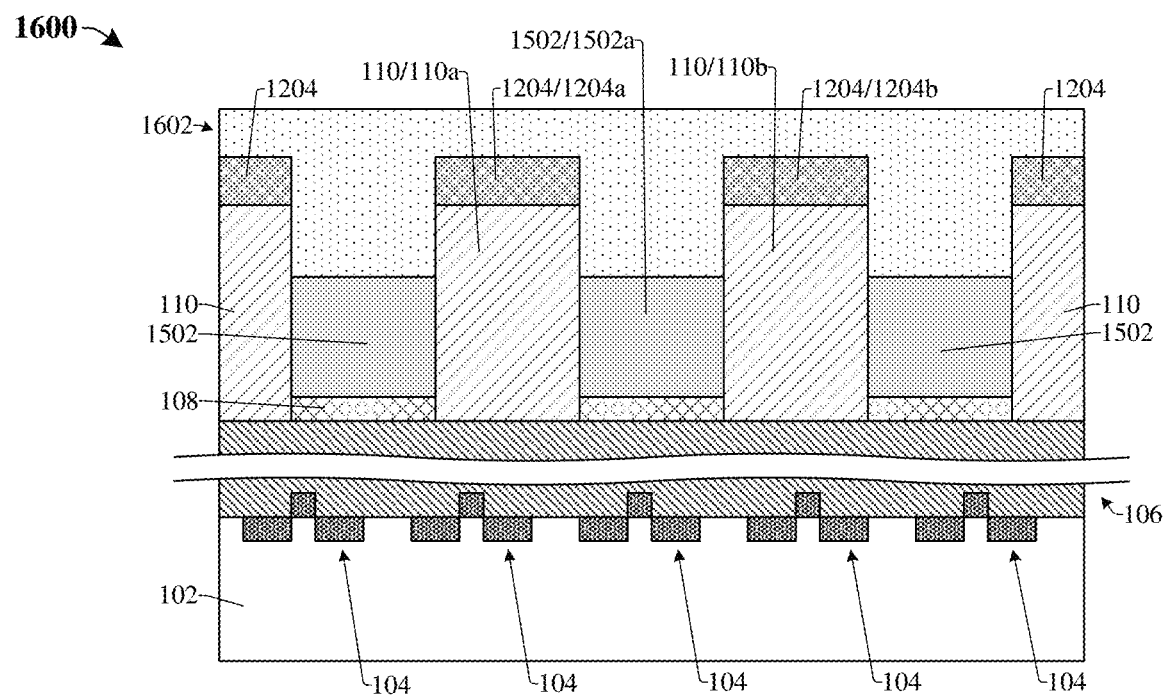
Figure 17:
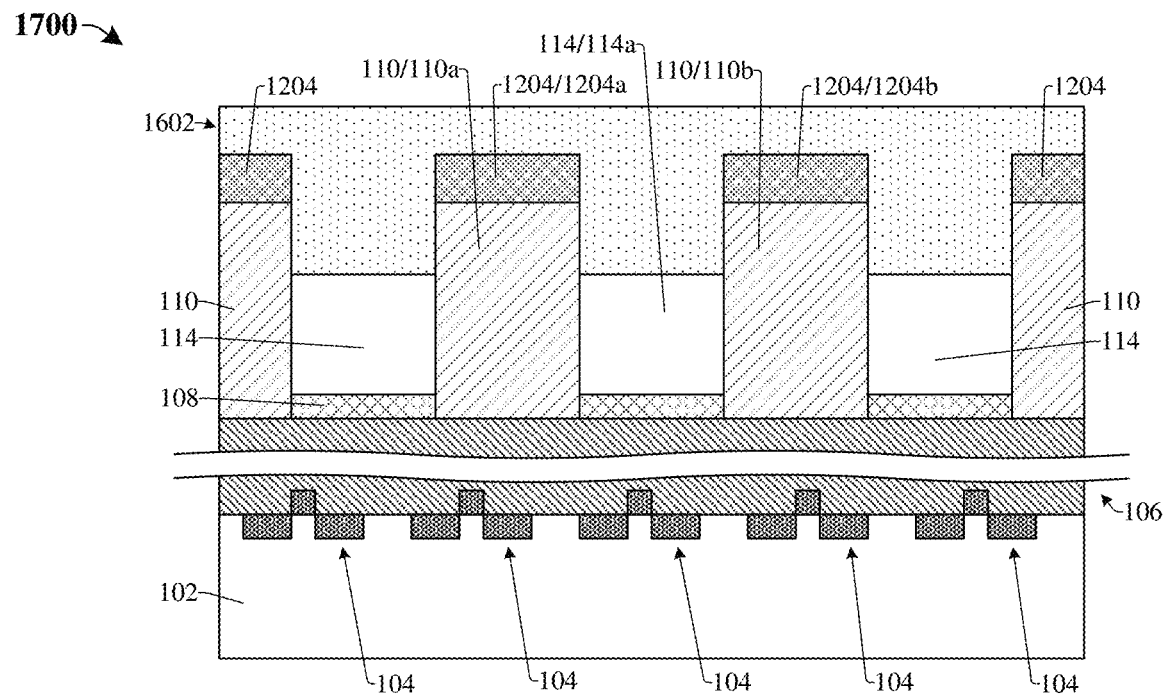

The first residual sacrificial structure 302a may be on any of the upper surface of the first etch-stop layer 108, the sidewall of the first metal wire 110a, the sidewall of the second metal wire 110b, and the lower surface of the first dielectric cap 112a because a first sacrificial structure (e.g., 1502a of FIGS. 15 and 17) may not be entirely removed from said surfaces during a sacrificial structure removal process (see, for example, FIGS. 16 and 17).

In some embodiments, the plurality of residual sacrificial structures 302 may, for example, comprise some organic material (e.g., some carbon-based material) or some other suitable material.

Further, in some embodiments, the first interconnect structure 106 may, for example, comprise middle-of-line (MOL) interconnect. For example, the MOL interconnect may comprise one or more lower etch-stop layers 106e, one or more lower dielectric layer 106d, one or more contacts 106c, one or more lower metal wires 106w, one or more lower vias 106v, or some other suitable features.

Figure 4:
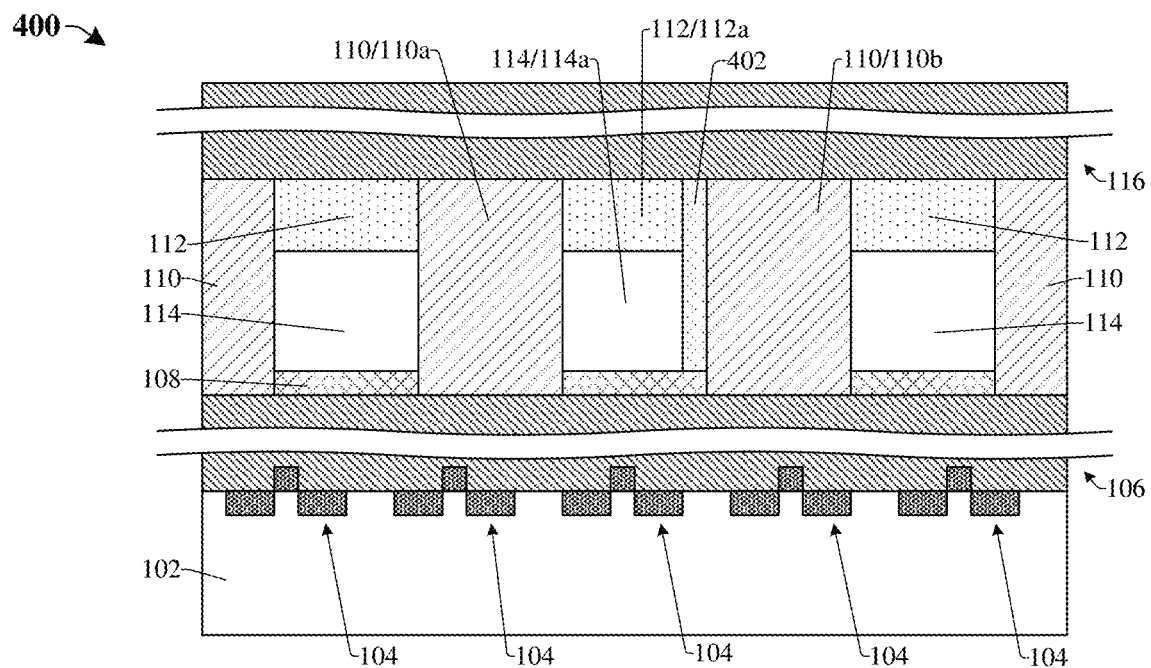
FIG. 4 illustrates a cross-sectional view of some alternative embodiments of the integrated chip of FIG. 1A in which the first cavity is defined by a first dielectric cap and a residual dielectric structure.

FIG. 4 illustrates a cross-sectional view 400 of some alternative embodiments of the integrated chip of FIG. 1A in which the first cavity 114a is defined by the first dielectric cap 112a and a residual dielectric structure 402.

In such embodiments, a first sidewall of the residual dielectric structure 402 extends along a sidewall of the second metal wire 110b, and a second sidewall of the residual dielectric structure 402 opposite the first sidewall partially defines the first cavity 114a. The residual dielectric structure 402 also extends along a sidewall of the first dielectric cap 112a and extends between the first dielectric cap 112a and the second metal wire 110b. The residual dielectric structure 402 may comprise a same or different material than the first dielectric cap 112a. For example, the residual dielectric structure 402 may comprise any of silicon oxide, silicon nitride, silicon oxynitride, silicon carbide, silicon oxycarbide, silicon carbonitride, silicon oxycarbonitride, some other low-k dielectric (e.g., having a dielectric constant of less than about 3.9), some other extreme low-k dielectric (e.g., having a dielectric constant of less than about 2), or some other suitable dielectric.

Figure 12:
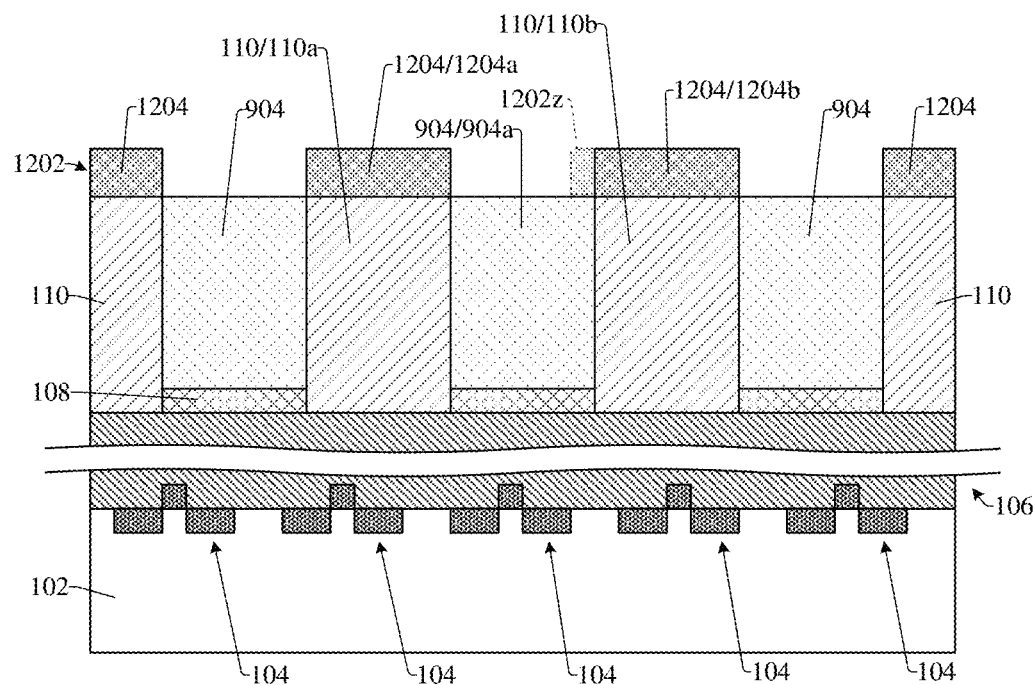
Figure 13:
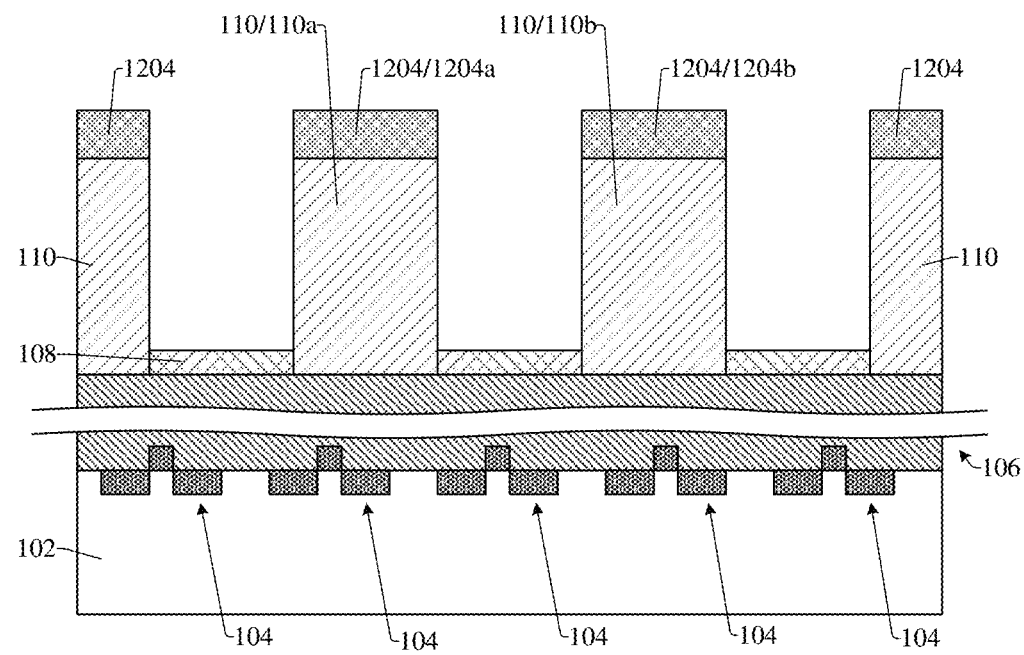

In some embodiments, the residual dielectric structure 402 may be on the sidewall of the second metal wire 110b due to a misalignment or offset when depositing and patterning a capping layer (e.g., 1202 of FIG. 12) that acts as a hard mask (see, for example, FIG. 13). Thus, a portion (e.g., 1202z of FIG. 12) of the capping layer may remain over a portion of a first dielectric structure (e.g., 904a of FIG. 12) when patterning the first dielectric structure (e.g., 904a of FIG. 12). As a result, the residual dielectric structure 402 may not be removed during the patterning (see, for example, FIGS. 12 and 13).

In some other embodiments, the residual dielectric structure 402 may be on the sidewall of the second metal wire 110b due to a loss of selectivity when forming the capping layer (e.g., 1202 of FIG. 12) on a top of the second metal wire 110b (see, for example, FIG. 12). Thus, a portion (e.g., 1202z of FIG. 12) of the capping layer may be formed over a first dielectric structure (e.g., 904a of FIG. 12). In turn, the residual dielectric structure 402 may not be removed when patterning the first dielectric structure (see, for example, FIGS. 12 and 13).

Figure 5:
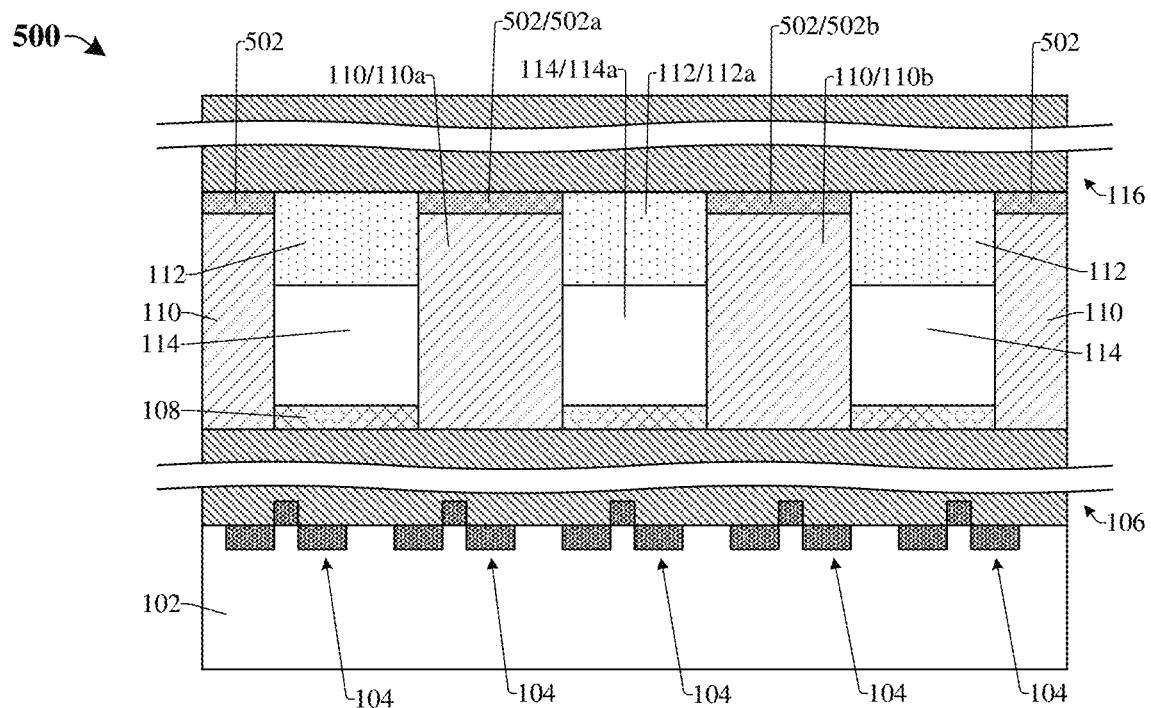
FIG. 5 illustrates a cross-sectional view of some alternative embodiments of the integrated chip of FIG. 1A in which a first residual capping structure is over the first metal wire and a second residual capping structure is over the second metal wire.

FIG. 5 illustrates a cross-sectional view 500 of some alternative embodiments of the integrated chip of FIG. 1A in which a first residual capping structure 502a is over the first metal wire 110a and a second residual capping structure 502b is over the second metal wire 110b.

In such embodiments, a plurality of residual capping structures 502 are on top surfaces of the plurality of metal wires 110. For example, the first residual capping structure 502a is on a top surface of the first metal wire 110a and the second residual capping structure 502b is on a top surface of the second metal wire 110b. Further, top surfaces of the plurality of residual capping structures 502 and top surfaces of the plurality of dielectric caps 112 may be approximately coplanar. Moreover, top surfaces of the plurality of dielectric caps 112 are above top surfaces of the plurality of metal wires 110.

Figure 18:
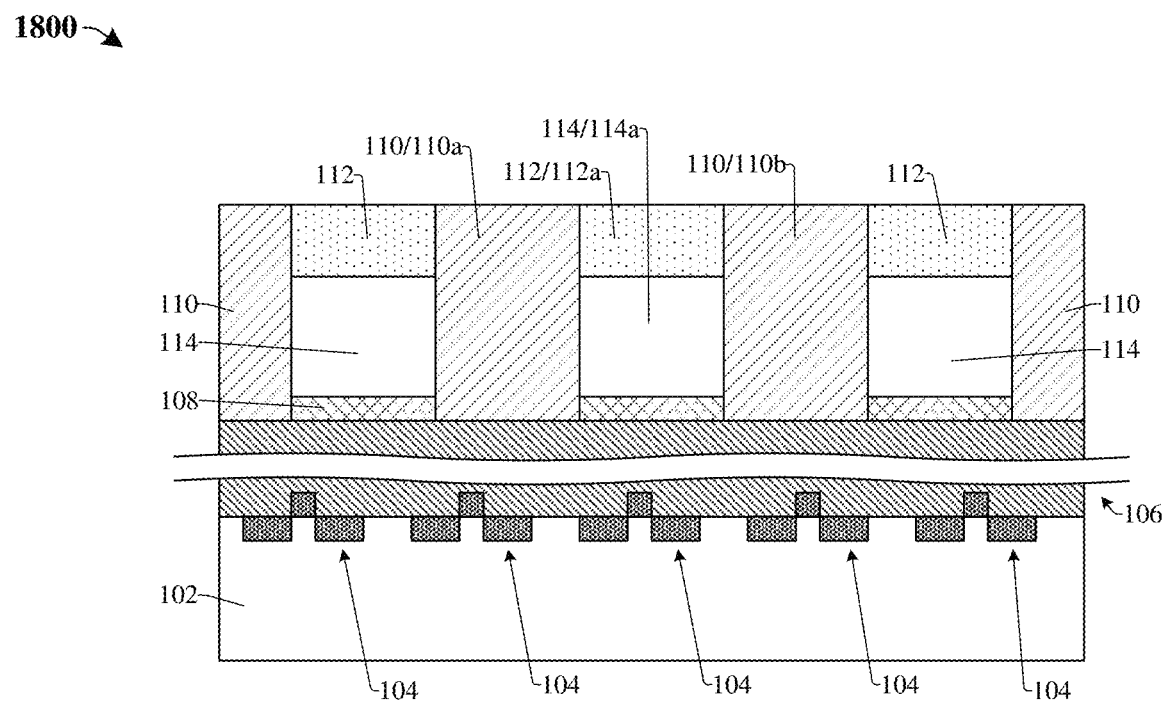

In some embodiments, the plurality of residual capping structures 502 may be on top surfaces of the plurality of metal wires 110 due to a plurality of capping structures (e.g., 1204 of FIGS. 12 to 17) not being entirely removed from the tops of the plurality of metal wires 110 during a planarization process (see, for example, FIGS. 17 and 18).

In some embodiments, the plurality of residual capping structures 502 may comprise one or more dielectrics or one or more metals. For example, the plurality of residual capping structures 502 may, for example, comprise any of hafnium oxide (e.g., HfO), lithium niobium oxide (e.g., LiNbO), lithium nickel oxide (e.g., LiNiO), magnesium oxide (e.g., MgO), manganese oxide (e.g., MnO), molybdenum oxide (e.g., MoO), niobium oxide (e.g., NbO), nickel oxide (e.g., NiO), silicon oxide (e.g., SiO), silicon oxycarbide (e.g., SiOC), silicon oxycarbonitride (e.g., SiOCN), silicon oxynitride (e.g., SiON), silicon carbide (e.g., SiC), tin oxide (e.g., SnO), tin silicon oxide (e.g., SnSiO), strontium oxide (e.g., SrO), tantalum oxide (e.g., TaO), tantalum oxynitride (e.g., TaON), titanium oxide (e.g., TiO), titanium oxynitride (e.g., TiON), tungsten oxide (e.g., WO), zinc oxide (e.g., ZnO), zirconium oxide (e.g., ZrOx), some other suitable dielectric, tantalum (e.g., Ta), tantalum nitride (e.g., TaN), titanium nitride (e.g., TiN), copper (e.g., Cu), cobalt (e.g., Co), ruthenium (e.g., Ru), molybdenum (e.g., Mo), iridium (e.g., Ir), tungsten (e.g., W), or some other suitable metal.

Figure 6A:
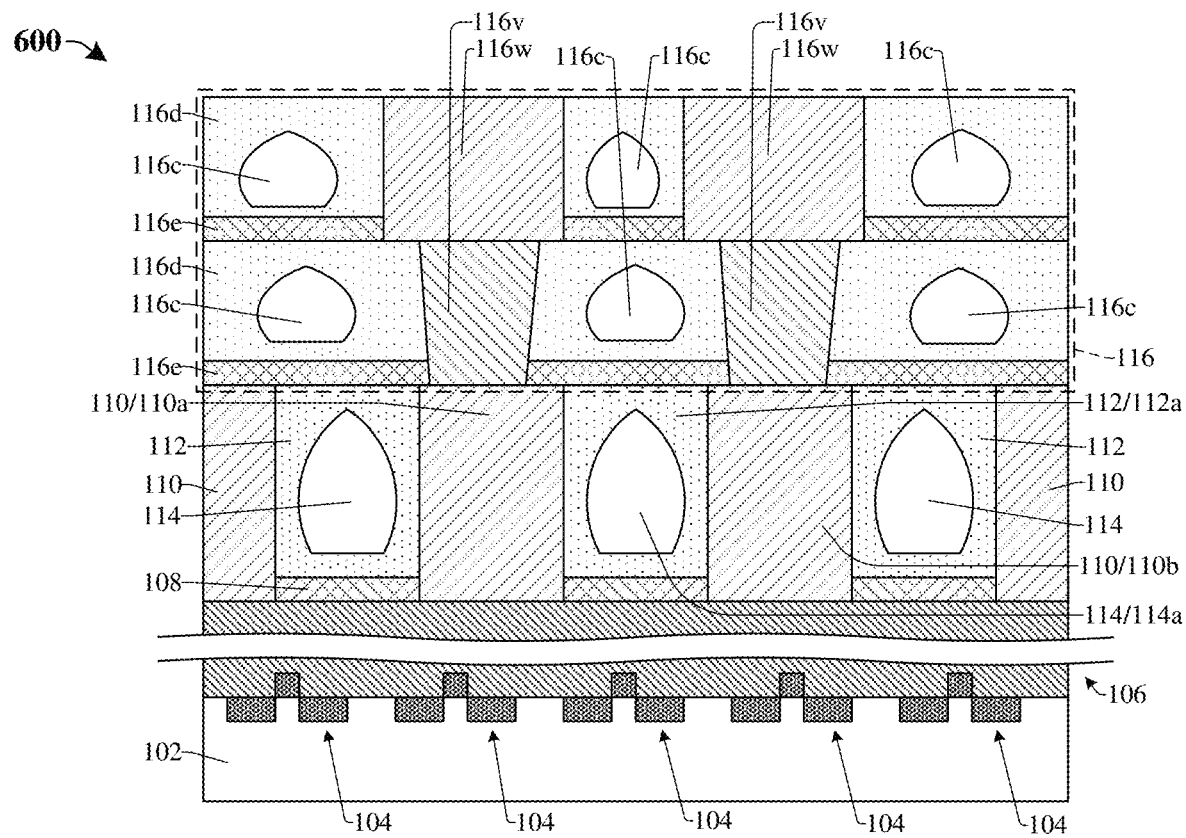
FIG. 6A illustrates a cross-sectional view of some alternative embodiments of the integrated chip of FIG. 1A in which a first dielectric cap surrounds the first cavity.

FIG. 6A illustrates a cross-sectional view 600 of some alternative embodiments of the integrated chip of FIG. 1A in which the first dielectric cap 112a surrounds the first cavity 114a.

In such embodiments, the first dielectric cap 112a is on a sidewall of the first metal wire 110a, on a sidewall of the second metal wire 110b, on a lower surface of the second interconnect structure 116 (e.g., on a lower surface of the upper etch-stop layer 116e of FIG. 2), and on an upper surface of the first etch-stop layer 108 such that the first dielectric cap 112a encloses the first cavity 114a. In other words, the first dielectric cap 112a extends in a closed path along a boundary of the first cavity 114a to surround the first cavity 114a. In yet other words, the first cavity 114a exists within the first dielectric cap 112a and is defined by one or more inner surfaces of the first dielectric cap 112a.

The first dielectric cap 112a may surround the first cavity 114a due to the conformality and/or a fill capability of the deposition process used to form the first dielectric cap 112a, and due to a pitch between the first metal wire 110a and the second metal wire 110b being small (e.g., less than 100 nanometers or some other suitable value).

In some embodiments, the second interconnect structure 116 may, for example, comprise one or more upper etch-stop layers 116e, one or more upper dielectric layers 116d, one or more upper vias 116v, one or more upper metal wires 116w, one or more upper cavities 116c, or some other suitable features (e.g., bond pads, solder bumps, etc.). For example, in such embodiments, the one or more upper vias 116v may be separated by the upper cavities 116c. Further, the one or more upper metal wires 116w may be over the one or more upper vias 116v and also may be separated by the upper cavities 116c. In some embodiments, other interconnect levels and/or features may also be included.

Figure 6B:
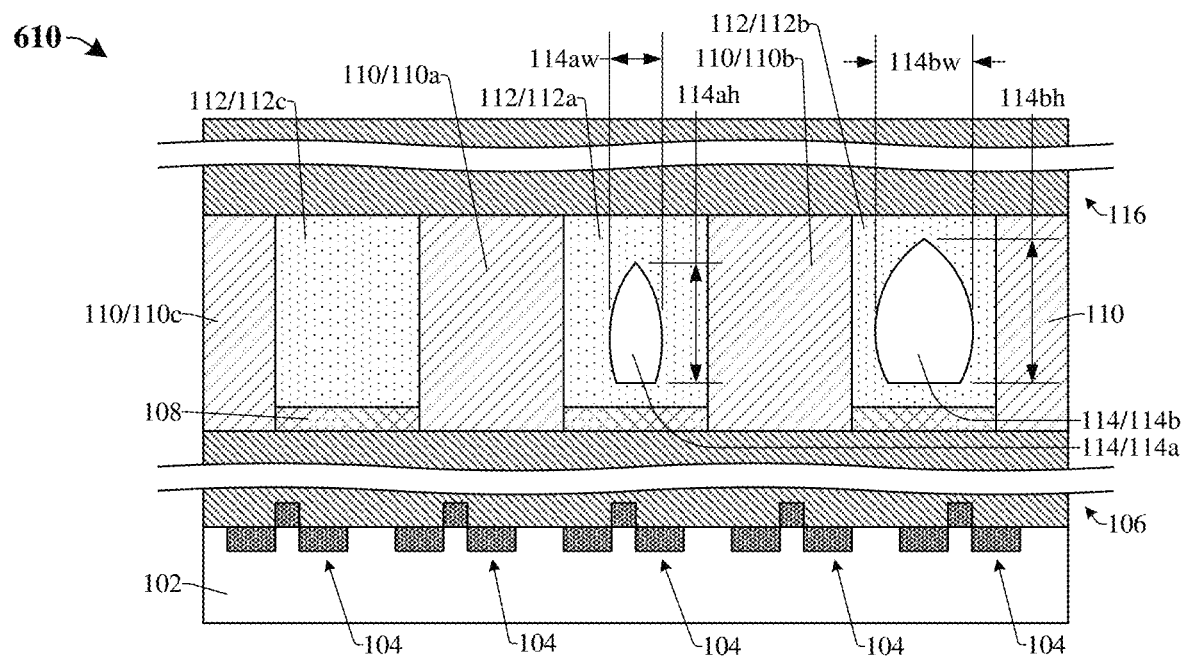
FIG. 6B illustrates a cross-sectional view of some alternative embodiments of the integrated chip of FIG. 6A in which the first cavity has a different size and/or shape than a second cavity.

FIG. 6B illustrates a cross-sectional view 610 of some alternative embodiments of the integrated chip of FIG. 6A in which the first cavity 114a has a different size and/or shape than a second cavity 114b.

In such embodiments, the second cavity 114b is adjacent to the first cavity 114a and is separated from the first cavity by the second metal wire 110b. Further, a width 114aw of the first cavity 114a is less than a width 114bw of the second cavity 114b. In addition, a height 114ah of the first cavity 114a is less than a height 114bh of the second cavity 114b.

Further, in some embodiments, a second dielectric cap 112b surrounds the second cavity 114b. In such embodiments, the first dielectric cap 112a may extend in a first closed path along a first boundary of the first cavity 114a to surround the first cavity 114a and the second dielectric cap 112b may extend in a second closed path, different from the first closed path, along a second boundary of the second cavity 114b to surround the second cavity 114b. For example, the second closed path may differ from the first closed path in length, shape, or the like.

The first cavity 114a may have a different size and/or shape than the second cavity 114b due to difference in pitch between the plurality of metal wires 110. Alternatively, the difference in the size and/or shape of the first and second cavities 114a, 114b may be a result of the deposition process which forms the first dielectric cap 112a and the second dielectric cap 112b (e.g., the difference may occur naturally during the deposition process).

In addition, in some embodiments, a third dielectric cap 112c is adjacent to the first dielectric cap 112a and is separated from the first dielectric cap 112a by the first metal wire 110a. Further, a third metal wire 110c is adjacent to the first metal wire 110a and is separated from the first metal wire 110a by the third dielectric cap 112c. In some embodiments, a cavity may not exist within the third dielectric cap 112c. This may be because a pitch between the first metal wire 110a and the third metal wire 110c is substantially large (e.g., large enough that the material deposited between the first metal wire 110a and the third metal wire 110c to form the third dielectric cap 112c fills a spacing between the first metal wire 110a and the third metal wire 110c completely).

Figure 6C:
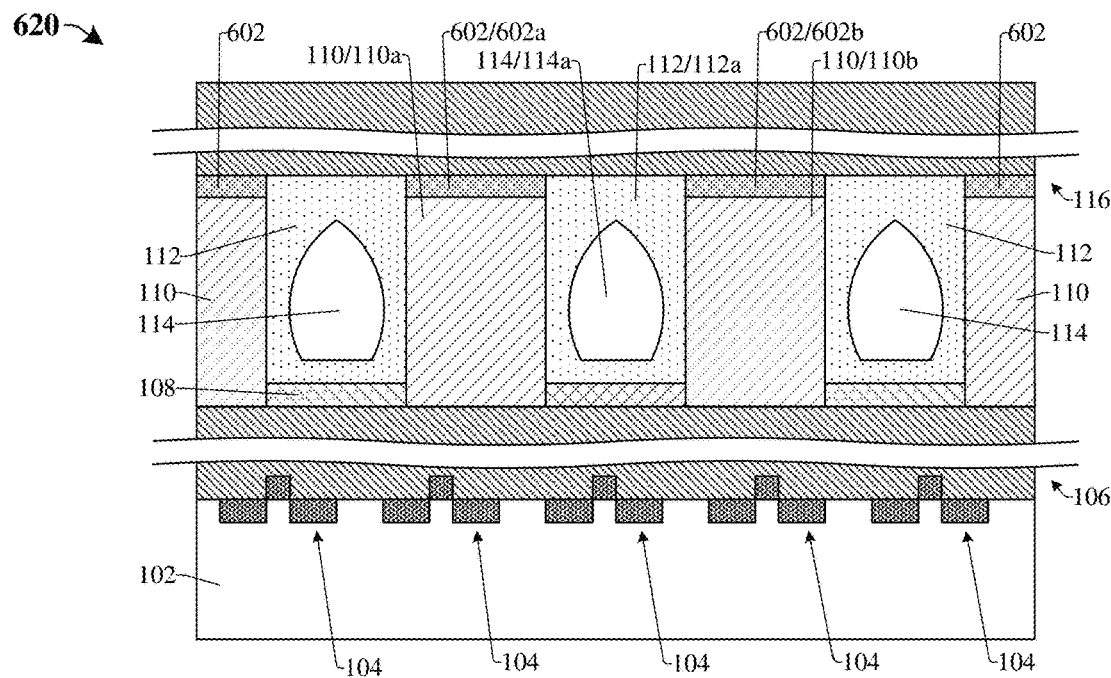
FIG. 6C illustrates a cross-sectional view of some alternative embodiments of the integrated chip of FIG. 6A in which a first residual capping structure is over the first metal wire and a second residual capping structure is over the second metal wire.

FIG. 6C illustrates a cross-sectional view 620 of some alternative embodiments of the integrated chip of FIG. 6A in which a first residual capping structure 602a is over the first metal wire 110a and a second residual capping structure 602b is over the second metal wire 110b.

In such embodiments, a plurality of residual capping structures 602 are on top surfaces of the plurality of metal wires 110. For example, the first residual capping structure 602a is on a top surface of the first metal wire 110a and the second residual capping structure 602b is on a top surface of the second metal wire 110b. Further, top surfaces of the plurality of residual capping structures 602 and top surfaces of the plurality of dielectric caps 112 may be approximately coplanar. Moreover, top surfaces of the plurality of dielectric caps 112 are above top surfaces of the plurality of metal wires 110.

Figure 20:
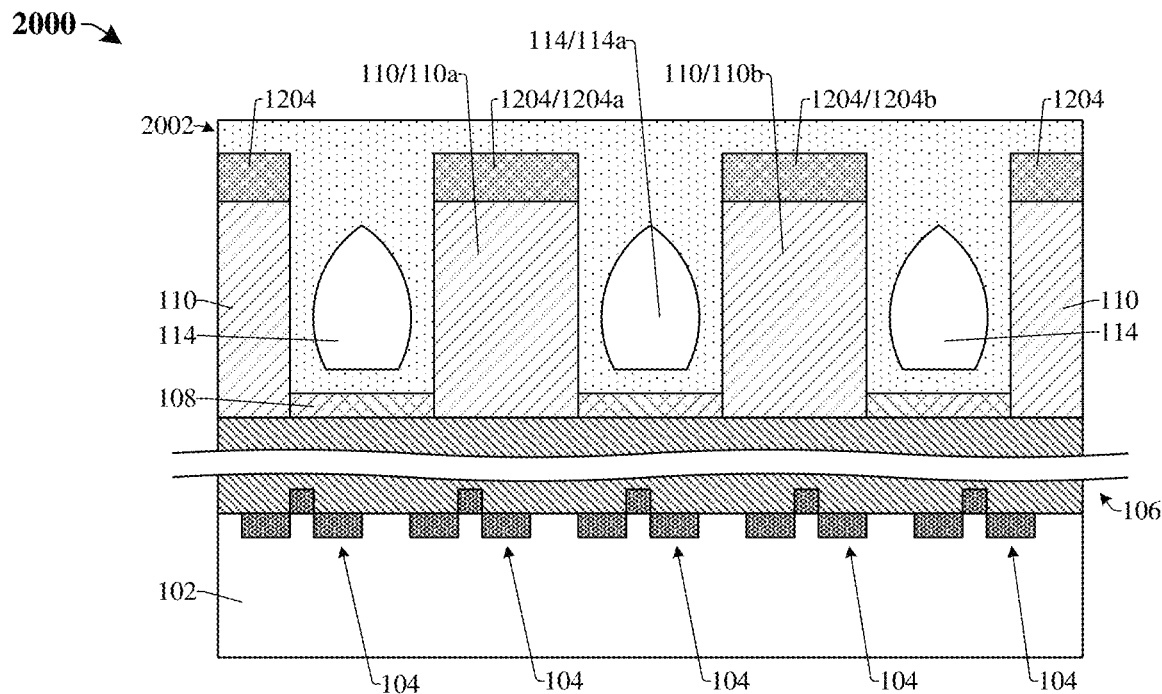
Figure 21:
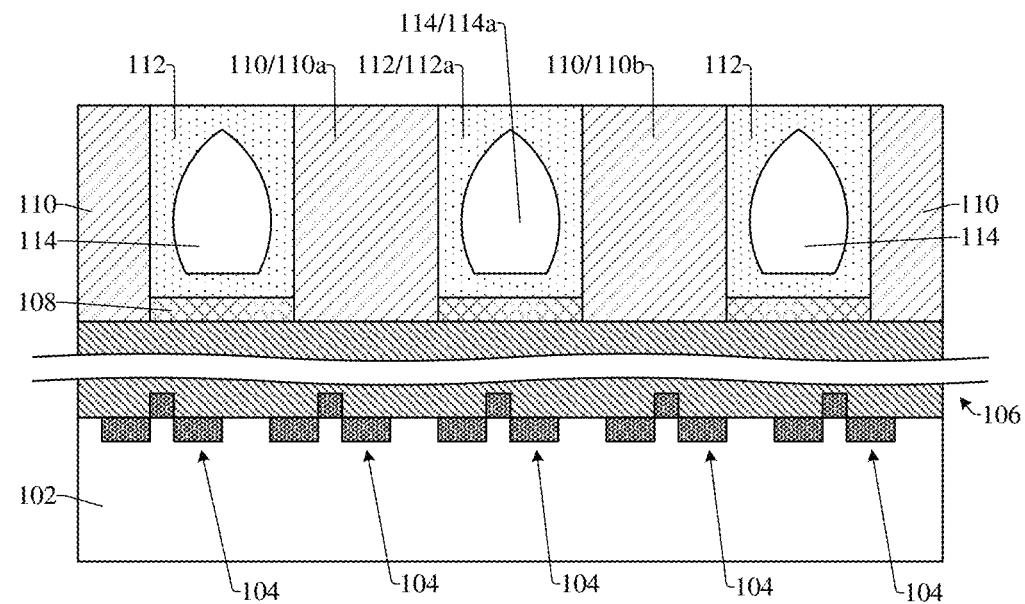

In some embodiments, the plurality of residual capping structures 602 may be on top surfaces of the plurality of metal wires 110 due to a plurality of capping structures (e.g., 1204 of FIGS. 12, 13, and 20) not being entirely removed from the tops of the plurality of metal wires 110 during a planarization process (see, for example, FIGS. 20 and 21).

In some embodiments, the plurality of residual capping structures 602 may comprise one or more dielectrics or one or more metals. For example, the plurality of residual capping structures 602 may, for example, comprise any of hafnium oxide (e.g., HfO), lithium niobium oxide (e.g., LiNbO), lithium nickel oxide (e.g., LiNiO), magnesium oxide (e.g., MgO), manganese oxide (e.g., MnO), molybdenum oxide (e.g., MoO), niobium oxide (e.g., NbO), nickel oxide (e.g., NiO), silicon oxide (e.g., SiO), silicon oxycarbide (e.g., SiOC), silicon oxycarbonitride (e.g., SiOCN), silicon oxynitride (e.g., SiON), silicon carbide (e.g., SiC), tin oxide (e.g., SnO), tin silicon oxide (e.g., SnSiO), strontium oxide (e.g., SrO), tantalum oxide (e.g., TaO), tantalum oxynitride (e.g., TaON), titanium oxide (e.g., TiO), titanium oxynitride (e.g., TiON), tungsten oxide (e.g., WO), zinc oxide (e.g., ZnO), zirconium oxide (e.g., ZrOx), some other suitable dielectric, tantalum (e.g., Ta), tantalum nitride (e.g., TaN), titanium nitride (e.g., TiN), copper (e.g., Cu), cobalt (e.g., Co), ruthenium (e.g., Ru), molybdenum (e.g., Mo), iridium (e.g., Ir), tungsten (e.g., W), or some other suitable metal.

FIGS. 7-22 illustrate cross-sectional views 700-2200 of some embodiments of a method for forming an integrated chip comprising a first metal wire 110a and a second metal wire 110b that are laterally separated by a first cavity 114a. Although FIGS. 7-22 are described in relation to a method, it will be appreciated that the structures disclosed in FIGS. 7-22 are not limited to such a method, but instead may stand alone as structures independent of the method.

Figure 7:
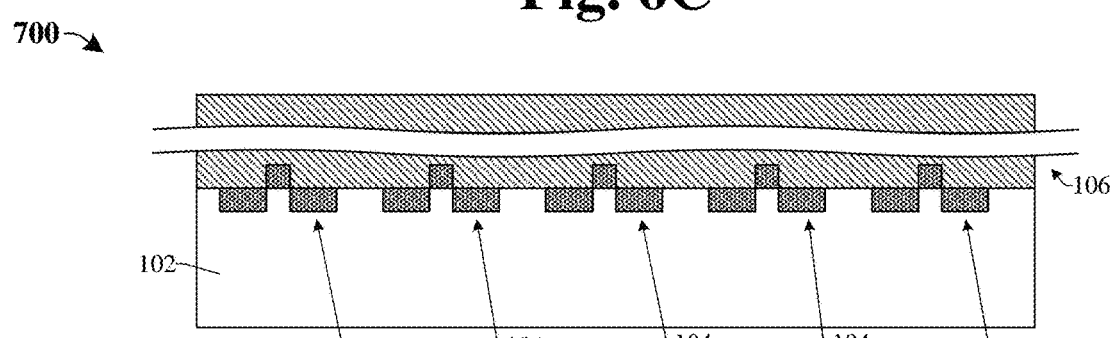
FIGS. 7-22 illustrate cross-sectional views of some embodiments of a method for forming an integrated chip comprising a first metal wire and a second metal wire that are laterally separated by a first cavity.

As shown in cross-sectional view 700 of FIG. 7, a substrate 102 is provided. Further, a plurality of semiconductor devices 104 are formed along the substrate 102 and a first interconnect structure 106 is formed over the substrate 102.

The plurality of semiconductor devices 104 may, for example, be formed by any of an ion implantation process, a diffusion process, a deposition process, a photolithography process, or some other suitable process.

In some embodiments, the first interconnect structure 106 may comprise one or more lower etch-stop layers (e.g., 106e of FIGS. 2 and/or 3), one or more lower dielectric layers (e.g., 106d of FIGS. 2 and/or 3), one or more contacts (e.g., 106c of FIGS. 2 and/or 3), one or more lower vias (e.g., 106v of FIG. 3), one or more lower metal wires (e.g., 106w of FIG. 3), or some other suitable features. In some embodiments, the first interconnect structure 106 may, for example, be formed by depositing the one or more lower etch-stop layers (e.g., 106e of FIGS. 2 and/or 3) over the substrate 102, depositing the one or more lower dielectric layers (e.g., 106d of FIGS. 2 and/or 3) over the etch-stop layer, patterning the one or more lower dielectric layers and the one or more lower etch-stop layers to form one or more openings in said layers, and forming the one or more contacts (e.g., 106c of FIGS. 2 and/or 3), the one or more lower vias (e.g., 106v of FIG. 3), and/or the one or more lower metal wires (e.g., 106w of FIG. 3) in said openings.

Figure 8:
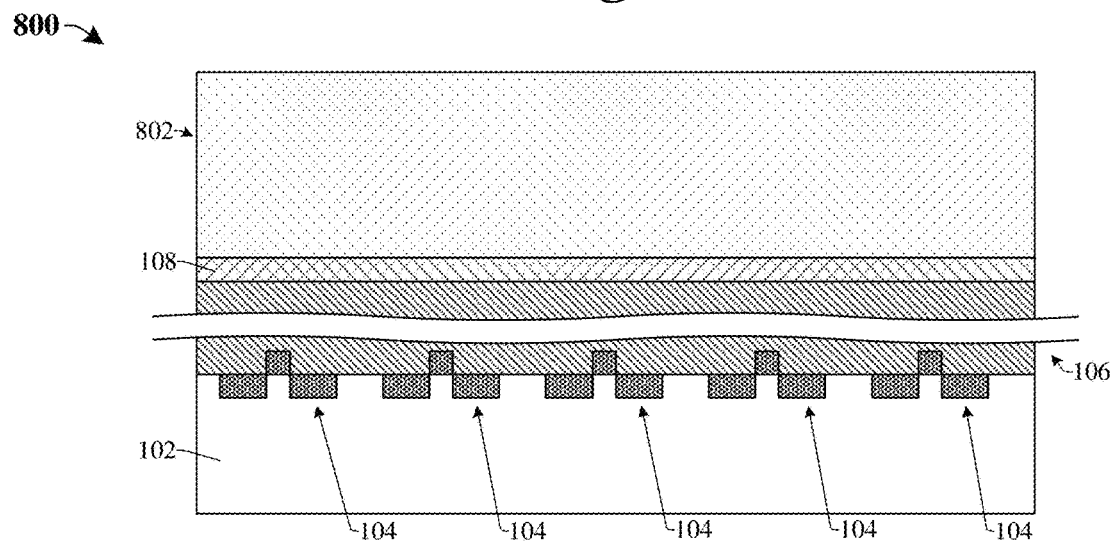

As shown in cross-sectional view 800 of FIG. 8, a first etch-stop layer 108 is formed over the first interconnect structure 106 and a first dielectric layer 802 is formed over the first etch-stop layer 108.

The first etch-stop layer 108 may, for example, be formed by depositing any of silicon carbide (e.g., SiC), silicon oxide (e.g., SiO2), silicon oxycarbide (e.g., SiOC), silicon nitride (e.g., SiN), silicon carbonitride (e.g., SiCN), silicon oxynitride (e.g., SiON), silicon oxycarbonitride (e.g., SiOCN), aluminum oxynitride (e.g., AlON), aluminum oxide (e.g., AlO), or some other suitable dielectric over the substrate 102 by any of a physical vapor deposition (PVD) process, a chemical vapor deposition (CVD) process, an atomic layer deposition (ALD) process, a spin-on process, or some other suitable process. A temperature during the deposition may, for example, be about 150 to 400 degrees Celsius or some other suitable value. A thickness of the first etch-stop layer 108 may, for example, be about 10 to 1000 angstroms or some other suitable value.

The first dielectric layer 802 may, for example, be formed by depositing any of silicon carbide, silicon oxide, silicon oxycarbide, silicon nitride, silicon carbonitride, silicon oxynitride, silicon oxycarbonitride, some other low-k dielectric (e.g., having a dielectric constant of less than about 3.9), some other extreme low-k dielectric (e.g., having a dielectric constant of less than about 2), or some other suitable dielectric over the substrate 102 by any of a PVD process, a CVD process, an ALD process, a spin on process, or some other suitable process. A temperature during the deposition may, for example, be about 50 to 400 degrees Celsius or some other suitable value. A thickness of the first dielectric layer 802 may, for example, be about 30 to 800 angstroms or some other suitable value.

Figure 9:
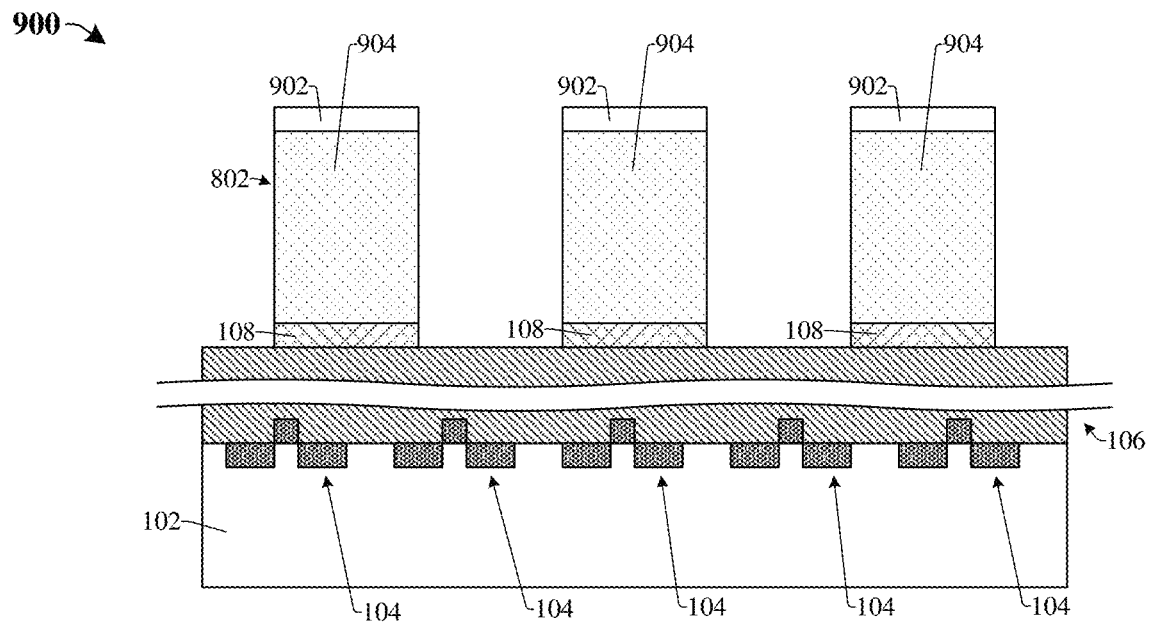

As shown in cross-sectional view 900 of FIG. 9, the first dielectric layer 802 and the first etch-stop layer 108 are patterned to define a plurality of dielectric structures 904 from the first dielectric layer 802. The patterning may, for example, comprise: 1) forming a mask 902 over the first dielectric layer 802; 2) performing an etch into the first dielectric layer 802 and the first etch-stop layer 108 with the mask in place; and 3) removing the mask 902. Other suitable patterning process(es) is/are however, amenable.

The mask 902 may, for example, comprise photoresist, silicon oxide, titanium nitride (e.g., TiN), or some other suitable material. The etch may, for example, comprise a wet etching process, a dry etching process, or some other suitable etching process.

Figure 10:
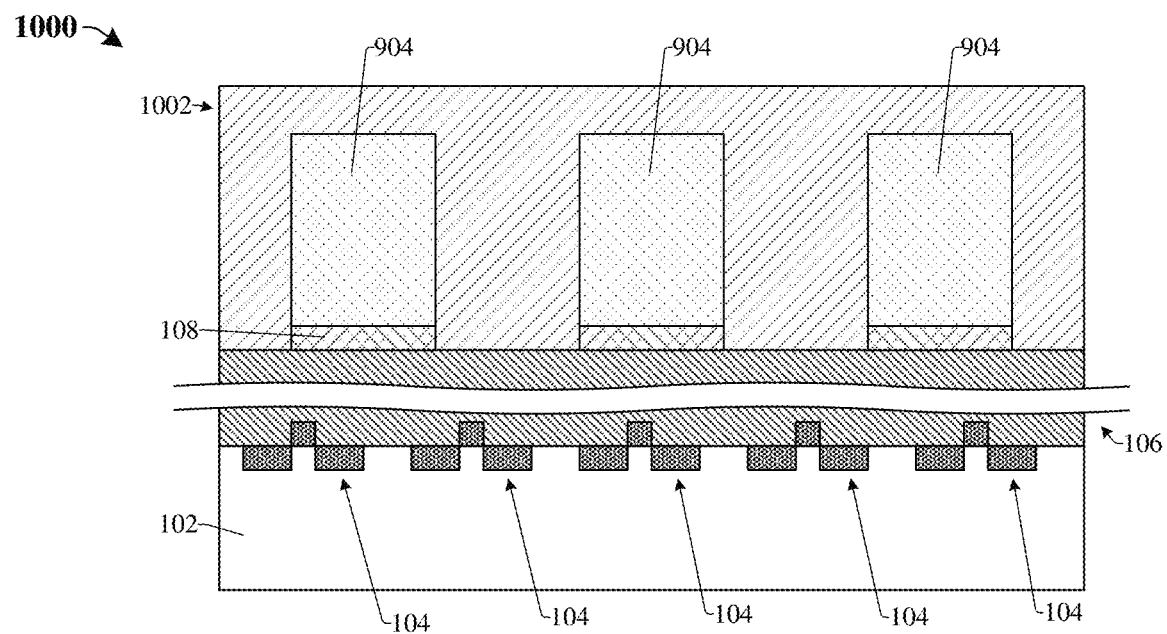

As shown in cross-sectional view 1000 of FIG. 10, a metal layer 1002 is deposited over the substrate 102 and between the plurality of dielectric structures 904. The metal layer 1002 may, for example, comprise any one or combination of tantalum (e.g., Ta), tantalum nitride (e.g., TaN), titanium nitride (e.g., TiN), copper (e.g., Cu), cobalt (e.g., Co), ruthenium (e.g., Ru), molybdenum (e.g., Mo), iridium (e.g., Jr), tungsten (e.g., W), or some other suitable material and may be deposited by any of a sputtering process, an electrochemical plating process, an electroless deposition process, a PVD process, a CVD process, an ALD process, or some other suitable process. A temperature during the deposition may, for example, be about 150 to 400 degrees Celsius or some other suitable value. A thickness of the metal layer 1002 may, for example, be about 10 to 1000 angstroms or some other suitable value.

Figure 11:
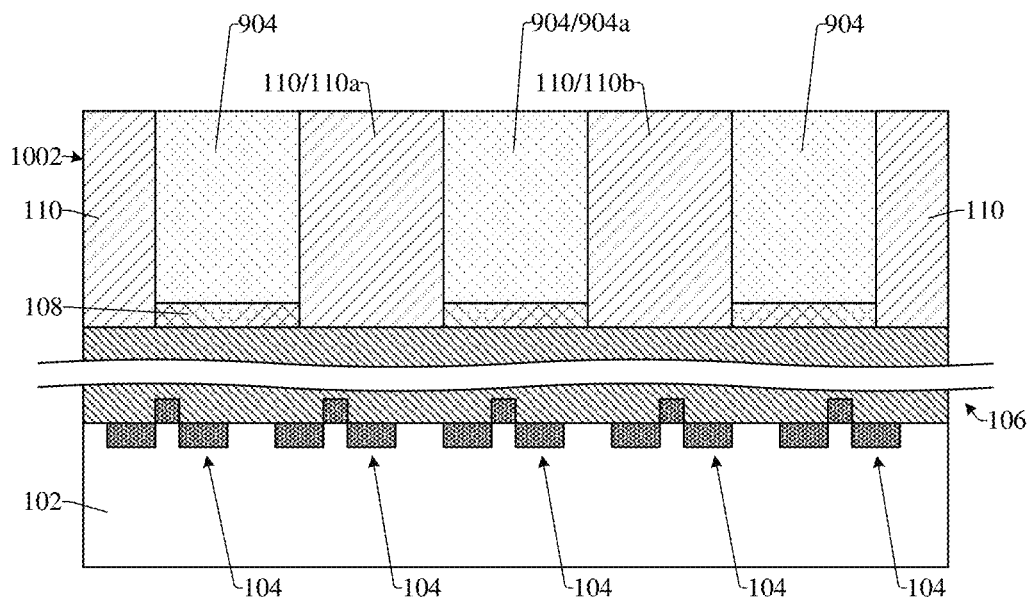

As shown in cross-sectional view 1100 of FIG. 11, a planarization process is performed on the metal layer 1002 to define a plurality of metal wires 110. For example, the planarization process defines a first metal wire 110a and a second metal wire 110b of the plurality of metal wires 110. The first metal wire 110a and the second metal wire 110b are laterally separated by a first dielectric structure 904a of the plurality of dielectric structures 904 and by the first etch-stop layer 108.

The planarization process may also be performed on the plurality of dielectric structures 904. As a result, top surfaces of the plurality of metal wires 110 and top surfaces of the plurality of dielectric structures 904 may be approximately coplanar. The planarization process may, for example, be or comprise a chemical-mechanical planarization (CMP) or some other suitable planarization process.

Although FIGS. 8 to 11 illustrate the plurality of metal wires 110 as being formed by depositing the metal layer 1002 between the plurality of dielectric structures 904 and subsequently planarizing the metal layer 1002, it will be appreciated that in some alternative embodiments, the metal layer 1002 may be deposited over the first interconnect structure 106, the metal layer 1002 may then be patterned to define the plurality of metal wires 110, a dielectric layer may then be deposited over the metal wires 110 and between the metal wires to form the plurality of dielectric structures 904, and the planarization process may then be performed on the dielectric layer.

As shown in cross-sectional view 1200 of FIG. 12, a capping layer 1202 is deposited on top surfaces of the plurality of metal wires 110 to form a plurality of capping structures 1204 on the top surfaces of the plurality of metal wires 110. For example, a first capping structure 1204a is formed on a first top surface of the first metal wire 110a and the second capping structure 1204b is formed on a second top surface of the second metal wire 110b. The capping layer 1202 and hence the plurality of capping structures 1204 may comprise one or more dielectrics, one or more metals, or some other suitable material.

In some embodiments, the capping layer 1202 is deposited over the plurality of metal wires 110 and over the plurality of dielectric structures 904 by any of a CVD process, a PVD process, an ALD process, a spin on process, an electrochemical plating (ECP) process, a sputtering process, or some other suitable process. Further, in such embodiments, the capping layer 1202 is subsequently patterned to remove the capping layer 1202 from top surfaces of the plurality of dielectric structures 904 and to define the plurality of capping structures 1204. In such embodiments, the patterning may, for example, comprise a photolithography/etching processor some other suitable patterning process. In some embodiments, a portion 1202z of the capping layer 1202 may remain on the first dielectric structure 904a due to a misalignment and/or offset when patterning the capping layer 1202.

In some other embodiments, the capping layer 1202 is selectively deposited so the capping layer 1202 deposits on the top surfaces of the plurality of metal wires 110 but not on top surfaces of the plurality of dielectric structures 904. The selective deposition may, for example, be performed by way of an area-selective ALD process or some other suitable selective deposition process. For example, the selective deposition process may comprise functionalizing top surfaces of the plurality of dielectric structures 904 (e.g., forming self-assembled monolayers (SAMs) or some other functional layer(s) on top surfaces of the plurality of dielectric structures 904) and depositing the capping layer 1202 by an ALD process. The functional layer(s) on the top surfaces of the plurality of dielectric structures 904 may block the capping layer 1202 from being deposited on the top surfaces of the plurality of dielectric structures 904.

In some embodiments, a small amount of the capping layer 1202 may be formed on the plurality of dielectric structures 904 during the ALD process. For example, the capping layer 1202 may be deposited on the plurality of dielectric structures 904 at a substantially slower rate than on the plurality of metal wires 110. In such embodiments, an atomic layer etching (ALE) process or some other suitable etching process may be performed to remove the small amount of capping layer 1202 from the plurality of dielectric structures 904. In some embodiments, the functionalization process, the deposition process, and the etching process may be repeated a number of times until the desired result is achieved. In some embodiments, a portion 1202z of the capping layer 1202 may be formed on the first dielectric structure 904a due to a loss of selectivity when forming the capping layer 1202.

A temperature during the deposition may, for example, be about 20 to 400 degrees Celsius (e.g., when the capping layer 1202 comprises a metal), about 150 to 400 degrees Celsius (e.g., when the capping layer 1202 comprises a dielectric), or some other suitable value. Further, the capping layer 1202 and hence the plurality of capping structures 1204 may have a thickness of about 10 to 1000 angstroms or some other suitable value.

The capping layer 1202 may, for example, comprise any of hafnium oxide (e.g., HfO), lithium niobium oxide (e.g., LiNbO), lithium nickel oxide (e.g., LiNiO), magnesium oxide (e.g., MgO), manganese oxide (e.g., MnO), molybdenum oxide (e.g., MoO), niobium oxide (e.g., NbO), nickel oxide (e.g., NiO), silicon oxide (e.g., SiO), silicon oxycarbide (e.g., SiOC), silicon oxycarbonitride (e.g., SiOCN), silicon oxynitride (e.g., SiON), silicon carbide (e.g., SiC), tin oxide (e.g., SnO), tin silicon oxide (e.g., SnSiO), strontium oxide (e.g., SrO), tantalum oxide (e.g., TaO), tantalum oxynitride (e.g., TaON), titanium oxide (e.g., TiO), titanium oxynitride (e.g., TiON), tungsten oxide (e.g., WO), zinc oxide (e.g., ZnO), zirconium oxide (e.g., ZrOx), some other suitable dielectric, tantalum (e.g., Ta), tantalum nitride (e.g., TaN), titanium nitride (e.g., TiN), copper (e.g., Cu), cobalt (e.g., Co), ruthenium (e.g., Ru), molybdenum (e.g., Mo), iridium (e.g., Ir), tungsten (e.g., W), or some other suitable metal.

As shown in cross-sectional view 1300 of FIG. 13, the plurality of dielectric structures 904 are removed from between the plurality of metal wires 110. For example, the first dielectric structure 904a is removed from between the first metal wire 110a and the second metal wire 110b.

In some embodiments, the plurality of dielectric structures 904 may be removed by a dry etching process or some other suitable process. For example, the plurality of dielectric structures 904 may be removed by an inductively coupled plasma (ICP) or capacitively coupled plasma (CCP) reactive ion etching (RIE) process that may utilize any one or combination of methane (e.g., CH4), fluoromethane (e.g., CH3F), difluoromethane (e.g., CH2F2), trifluoromethane (e.g., CHF3), octafluorocyclobutane (e.g., C4F8), hexafluoro-1,3-butadiene (e.g., C4F6), tetrafluoromethane (e.g., CF4), hydrogen (e.g., H2), hydrogen bromide (e.g., HBr), carbon monoxide (e.g., CO), carbon dioxide (e.g., CO2), oxygen (e.g., O2), boron trichloride (e.g., BCl3), chlorine (e.g., Cl2), nitrogen (e.g., N2), helium (e.g., He), neon (e.g., Ne), argon (e.g., Ar), or some other suitable gas. In some embodiments, a pressure during the etching may, for example, be about 0.2 to 120 millitorr or some other suitable value. A temperature during the etching may, for example, be about 0 to 100 degrees Celsius or some other suitable value. A power applied during the etching may be about 50 to 3000 watts or some other suitable value. A bias voltage applied during the etching may, for example, be about 0 to 1200 volts or some other suitable value.

In some embodiments, the plurality of capping structures 1204 may act as a hard mask during the etching process. Further, the etching process may be highly selective to the plurality of dielectric structures 904 relative to the plurality of capping structures 1204 (e.g., the plurality of dielectric structures 904 may be etched at a substantially faster rate than the plurality of capping structures 1204). For example, the etching process may remove the plurality of dielectric structures 904 a first rate and may remove the plurality of capping structures 1204 at a second rate that is slower than the first rate by a factor of about 10 or more, by a factor of 20 or more, or by some other factor.

Because the plurality of dielectric structures 904 have a high selectivity relative to the plurality of capping structures 1204 during the etching process, top surfaces the plurality of metal wires 110 may not be damaged during the etching process. For example, the plurality of capping structures 1204 may protect the top surfaces of the underlying plurality of metal wires 110 from the etching process.

Further, because of the anisotropic characteristics of the dry etching process used to remove the plurality of dielectric structures 904, the etching process may not etch away and/or damage sidewalls of the plurality of metal wires 110. For example, because the dry etching process used has little to no lateral component, sidewalls of the plurality of metal wires 110 may not be damaged during the etching.

As a result, in some embodiments, top surfaces and sidewalls of the plurality of metal wires 110 may be substantially planar. Additionally, or alternatively, the top surfaces and sidewalls of the plurality of metal wires 110 may be devoid of nanoscopic voids. Thus, a structural integrity of the plurality of metal wires 110 may not be reduced and a hence a reliability of the plurality of metal wires 110 may be high.

In contrast, were the plurality of dielectric structures 904 to be removed with an etch without the plurality of capping structures 1204 on the top surfaces of the plurality of metal wires 110, the top surfaces of the plurality of metal wires 110 could be damaged by the etch. Sidewalls of the plurality of metal wires 110 could also be damaged by the etch if the etch were performed without the plurality of capping structures 1204 in place.

FIGS. 14 to 19 illustrate cross-sectional views 1400-1900 of first embodiments for performing a remainder of the method. The acts at FIGS. 14 to 19 proceed from the acts at FIGS. 7-13 in the first embodiments of the method.

Figure 14:
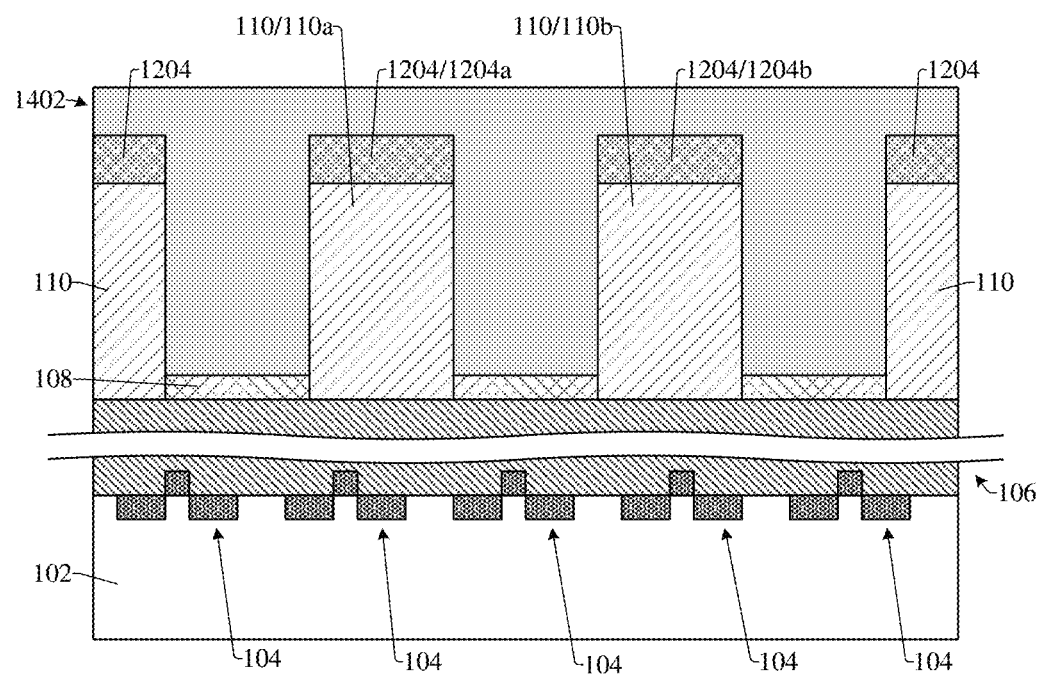

As shown in cross-sectional view 1400 of FIG. 14, a sacrificial layer 1402 is deposited over the substrate 102 and between the plurality of metal wires 110. The sacrificial layer 1402 may take the place of the previously removed plurality of dielectric structures (e.g., 904 of FIG. 12). The sacrificial layer 1402 may, for example, comprise some organic material (e.g., some carbon-based material) or some other suitable material and may be deposited by any of a PVD process, a CVD process, an ALD process, a spin on process, or some other suitable process. A temperature during the deposition may, for example, be about 50 to 400 degrees Celsius or some other suitable value. The sacrificial layer 1402 may, for example, have a thickness of about 30 to 600 angstroms or some other suitable value.

As shown in cross-sectional view 1500 of FIG. 15, the sacrificial layer 1402 is recessed to define a plurality of sacrificial structures 1502 between the plurality of metal wires 110. As a result, top surfaces of the plurality of sacrificial structures 1502 are below top surfaces of the plurality of metal wires 110 (e.g., below the first top surface of the first metal wire 110a and below the second top surface of the second metal wire 110b). For example, the recessing defines a first sacrificial structure 1502a between the first metal wire 110a and the second metal wire 110b.

The recessing may, for example, comprise a dry etching process or some other suitable process. For example, recessing may comprise an ICP or CCP reactive ion etching (RIE) process that may utilize any one or combination of methane, fluoromethane, difluoromethane, trifluoromethane, octafluorocyclobutane, hexafluoro-1,3-butadiene, tetrafluoromethane, hydrogen, hydrogen bromide, carbon monoxide, carbon dioxide, oxygen, boron trichloride, chlorine, nitrogen, helium, neon, argon, or some other suitable gas. In some embodiments, a pressure during the etching may, for example, be about 0.2 to 120 millitorr or some other suitable value. A temperature during the etching may, for example, be about 0 to 100 degrees Celsius or some other suitable value. A power applied during the etching may be about 50 to 3000 watts or some other suitable value. A bias voltage applied during the etching may, for example, be about 0 to 1200 volts or some other suitable value.

In some embodiments, the recessing results in the plurality of sacrificial structures 1502 having curved (e.g., concave) upper surfaces 1502u.

In some embodiments, the plurality of capping structures 1204 may act as a hard mask during the recessing process. Further, the recessing process may be highly selective to the sacrificial layer 1402 relative to the plurality of capping structures 1204 (e.g., the sacrificial layer 1402 may be etched at a substantially faster rate than the plurality of capping structures 1204).

Because the sacrificial layer 1402 has a high selectivity relative to the plurality of capping structures 1204 during the recessing process, top surfaces the plurality of metal wires 110 may not be damaged during the recessing process. Further, because of the anisotropic characteristics of the dry etching process used to recess the sacrificial layer 1402, the recessing process may not etch away and/or damage sidewalls of the plurality of metal wires 110.

As a result, in some embodiments, top surfaces and sidewalls of the plurality of metal wires 110 may remain substantially planar. Additionally, or alternatively, the top surfaces and sidewalls of the plurality of metal wires 110 may remain devoid of nanoscopic voids. Thus, a structural integrity of the plurality of metal wires 110 may be maintained and a hence a reliability of the plurality of metal wires 110 may be high.

As shown in cross-sectional view 1600 of FIG. 16, a second dielectric layer 1602 is formed directly over the plurality of sacrificial structures 1502 and between the plurality of metal wires 110. The second dielectric layer 1602 may, for example, be formed by depositing any of silicon carbide, silicon oxide, silicon oxycarbide, silicon nitride, silicon carbonitride, silicon oxynitride, silicon oxycarbonitride, some other low-k dielectric (e.g., having a dielectric constant of less than about 3.9), some other extreme low-k dielectric (e.g., having a dielectric constant of less than about 2), or some other suitable dielectric over the substrate 102 by any of a PVD process, a CVD process, an ALD process, a spin on process, or some other suitable process. A temperature during the deposition may, for example, be about 50 to 400 degrees Celsius or some other suitable value. A thickness of the second dielectric layer 1602 may, for example, be about 30 to 800 angstroms or some other suitable value or some other suitable value.

As shown in cross-sectional view 1700 of FIG. 17, the plurality of sacrificial structures 1502 are removed from directly below the second dielectric layer 1602 and from between the plurality of metal wires 110, thereby leaving a plurality of cavities 114 in place of the plurality of sacrificial structures 1502. For example, the first sacrificial structure 1502a is removed from between the first metal wire 110a and the second metal wire 110b, thereby leaving a first cavity 114a in place of the first sacrificial structure 1502a.

The plurality of sacrificial structures 1502 are be removed from directly below the second dielectric layer 1602 with the second dielectric layer 1602 in place. In some embodiments, the plurality of sacrificial structures 1502 may, for example, be removed by a thermal (e.g., baking) process which may vaporize the plurality of sacrificial structures 1502 and the vapor may escape the plurality of cavities 114 by passing through the second dielectric layer 1602. In some other embodiments, the plurality of sacrificial structures 1502 may be vaporized upon being exposed to a laser or a UV light. In some other embodiments, some other process(es) may be used to remove the plurality of sacrificial structures 1502 from directly below the second dielectric layer 1602.

In some embodiments, the plurality of sacrificial structures 1502 may not be entirely removed from directly below the second dielectric layer 1602 and from between the plurality of metal wires 110. As a result, a plurality of residual sacrificial structures (e.g., 302 of FIG. 3) may remain directly below the second dielectric layer 1602 and between the plurality of metal wires 110.

As shown in cross-sectional view 1800 of FIG. 18, a planarization process is performed on the second dielectric layer 1602 to define a plurality of dielectric caps 112 and on the plurality of capping structures 1204 to remove the plurality of capping structures 1204 from over the plurality of metal wires 110. For example, the planarization process defines a first dielectric cap 112a of the plurality of dielectric caps 112 that is between the first metal wire and the second metal wire 110b, and that is directly over the first cavity 114a.

The planarization process may also be performed on the plurality of metal wires 110. As a result, top surfaces of the plurality of metal wires 110 and top surfaces of the plurality of dielectric caps 112 may be approximately coplanar. For example, a top surface of the first metal wire, a top surface of the second metal wire 110b, and a top surface of the first dielectric cap 112a may be approximal coplanar. The planarization process may, for example, be or comprise a CMP or some other suitable planarization process.

Although FIGS. 16 to 18 illustrate the second dielectric layer 1602 being planarized after the plurality of sacrificial structures 1502 are removed, it will be appreciated that in some other embodiments, the second dielectric layer 1602 may be planarized before the plurality of sacrificial structures (e.g., 1502 of FIGS. 15 and 16) are removed.

Further, in some embodiments, the planarization process may not entirely remove the plurality of capping structures 1204 from over the plurality of metal wires 110. Thus, in such embodiment's, a plurality of residual capping structures (e.g., 502 of FIG. 5) may remain over the plurality of metal wires 110.

Figure 19:
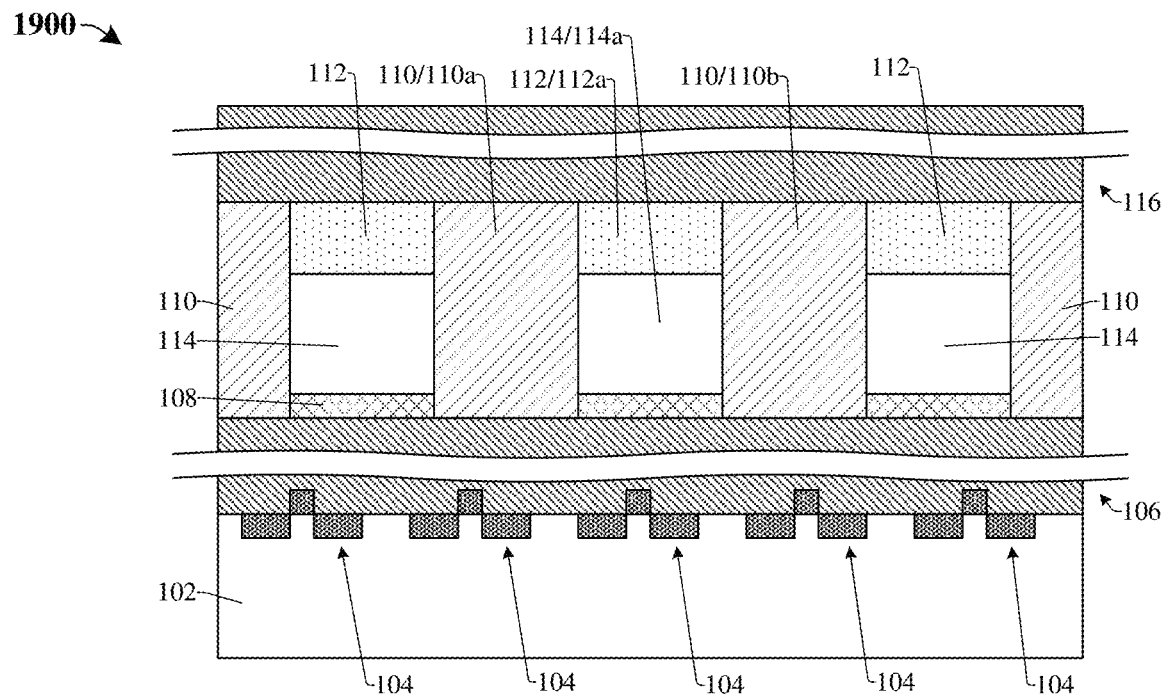

As shown in cross-sectional view 1900 of FIG. 19, a second interconnect structure 116 is formed over the plurality of metal wires 110 and the plurality of dielectric caps 112. The second interconnect structure 116 may, for example, be formed by repeating the aforementioned method to form one or more upper etch-stop layers (e.g., 116e of FIG. 2), one or more upper dielectric layers (e.g., 116d of FIG. 2), one or more upper vias (e.g., 116v of FIG. 2), one or more upper metal wires (e.g., 116w of FIG. 2), one or more upper cavities (e.g., 116c of FIG. 2), or some other suitable features.

For example, in some embodiments, an upper etch-stop layer (e.g., 116e of FIGS. 2 and/or 3) may be formed over the plurality of metal wires 110 and over the plurality of dielectric caps 112 by depositing any one or more of silicon carbide, silicon oxide, silicon oxycarbide, silicon nitride, silicon carbonitride, silicon oxynitride, silicon oxycarbonitride, aluminum oxynitride, aluminum oxide, or some other suitable dielectric over the substrate 102 by any of a CVD process, a PVD process, an ALD process, a spin on process, or some other suitable process. A temperature during the deposition may, for example, be about 150 to 400 degrees Celsius or some other suitable value. A thickness of the upper etch-stop layer (e.g., 116e of FIGS. 2 and/or 3) may, for example, be about 10 to 1000 angstroms or some other suitable value.

Figure 22:
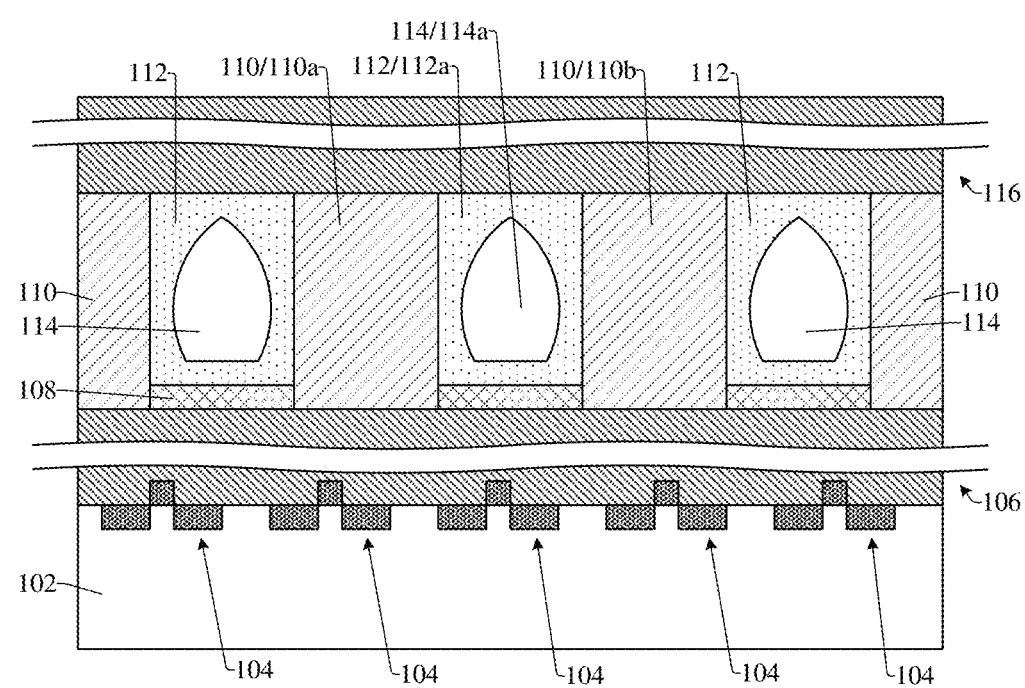

FIGS. 20 to 22 illustrate cross-sectional views 2000-2200 of second embodiments for performing the remainder of the method. The acts at FIGS. 20 to 22 proceed from the acts at FIGS. 7-13, while skipping the acts at FIGS. 14-19, in the second embodiments of the method.

As shown in cross-sectional view 2000 of FIG. 20, a second dielectric layer 2002 is formed directly over first etch-stop layer 108 and between the plurality of metal wires 110. The second dielectric layer 2002 may, for example, be formed by depositing any of silicon carbide, silicon oxide, silicon oxycarbide, silicon nitride, silicon carbonitride, silicon oxynitride, silicon oxycarbonitride, some other low-k dielectric (e.g., having a dielectric constant of less than about 3.9), some other extreme low-k dielectric (e.g., having a dielectric constant of less than about 2), or some other suitable dielectric over the substrate 102 by any of a PVD process, a CVD process, an ALD process, a spin on process, or some other suitable process. A temperature during the deposition may, for example, be about 50 to 400 degrees Celsius or some other suitable value. A thickness of the second dielectric layer 2002 may, for example, be about 30 to 800 angstroms or some other suitable value.

A plurality of cavities 114 exist within the second dielectric layer 2002 and between the plurality of metal wires 110 after depositing the second dielectric layer 2002. For example, a first cavity 114a exists between the first metal wire 110a and the second metal wire 110b and is defined by one or more surfaces of the second dielectric layer 2002. The plurality of cavities 114 may exist because of the conformality and/or fill capabilities of the deposition of the second dielectric layer 2002. For example, a pitch of the plurality of metal wires 110 may be small and hence the second dielectric layer 2002 may not completely fill a space between the plurality of metal wires 110. As a result, the plurality of cavities 114 are formed within the second dielectric layer 2002 between the plurality of metal wires 110.

As shown in cross-sectional view 2100 of FIG. 21, a planarization process is performed on the second dielectric layer 2002 to define a plurality of dielectric caps 112 and on the plurality of capping structures 1204 to remove the plurality of capping structures 1204 from over the plurality of metal wires 110. For example, the planarization process defines a first dielectric cap 112a of the plurality of dielectric caps 112.

The planarization process may also be performed on the plurality of metal wires 110. As a result, tops surfaces of the plurality of metal wires 110 and top surfaces of the plurality of dielectric caps 112 may be approximately coplanar. For example, a top surface of the first metal wire, a top surface of the second metal wire 110b, and a top surface of the first dielectric cap 112a may be approximal coplanar. The planarization process may, for example, be or comprise a CMP or some other suitable planarization process.

Further, in some embodiments, the planarization process may not entirely remove the plurality of capping structures 1204 from over the plurality of metal wires 110. Thus, in such embodiment's, a plurality of residual capping structures (e.g., 602 of FIG. 6) may remain over the plurality of metal wires 110.

As shown in cross-sectional view 2200 of FIG. 22, a second interconnect structure 116 is formed over the plurality of metal wires 110 and the plurality of dielectric caps 112. The second interconnect structure 116 may, for example, be formed by repeating the aforementioned method to form one or more upper etch-stop layers (e.g., 116e of FIG. 6A), one or more upper dielectric layers (e.g., 116d of FIG. 6A), one or more upper vias (e.g., 116v of FIG. 6A), one or more upper metal wires (e.g., 116w of FIG. 6A), one or more upper cavities (e.g., 116c of FIG. 6A), or some other suitable features.

For example, in some embodiments, an upper etch-stop layer (e.g., 116e of FIG. 6A) may be formed over the plurality of metal wires 110 and over the plurality of dielectric caps 112 by depositing any one or more of silicon carbide, silicon oxide, silicon oxycarbide, silicon nitride, silicon carbonitride, silicon oxynitride, silicon oxycarbonitride, aluminum oxynitride, aluminum oxide, or some other suitable dielectric over the substrate 102 by any of a CVD process, a PVD process, an ALD process, a spin on process, or some other suitable process. A temperature during the deposition may, for example, be about 150 to 400 degrees Celsius or some other suitable value. A thickness of the upper etch-stop layer (e.g., 116e of FIG. 6A) may, for example, be about 10 to 1000 angstroms or some other suitable value.

Figure 23:
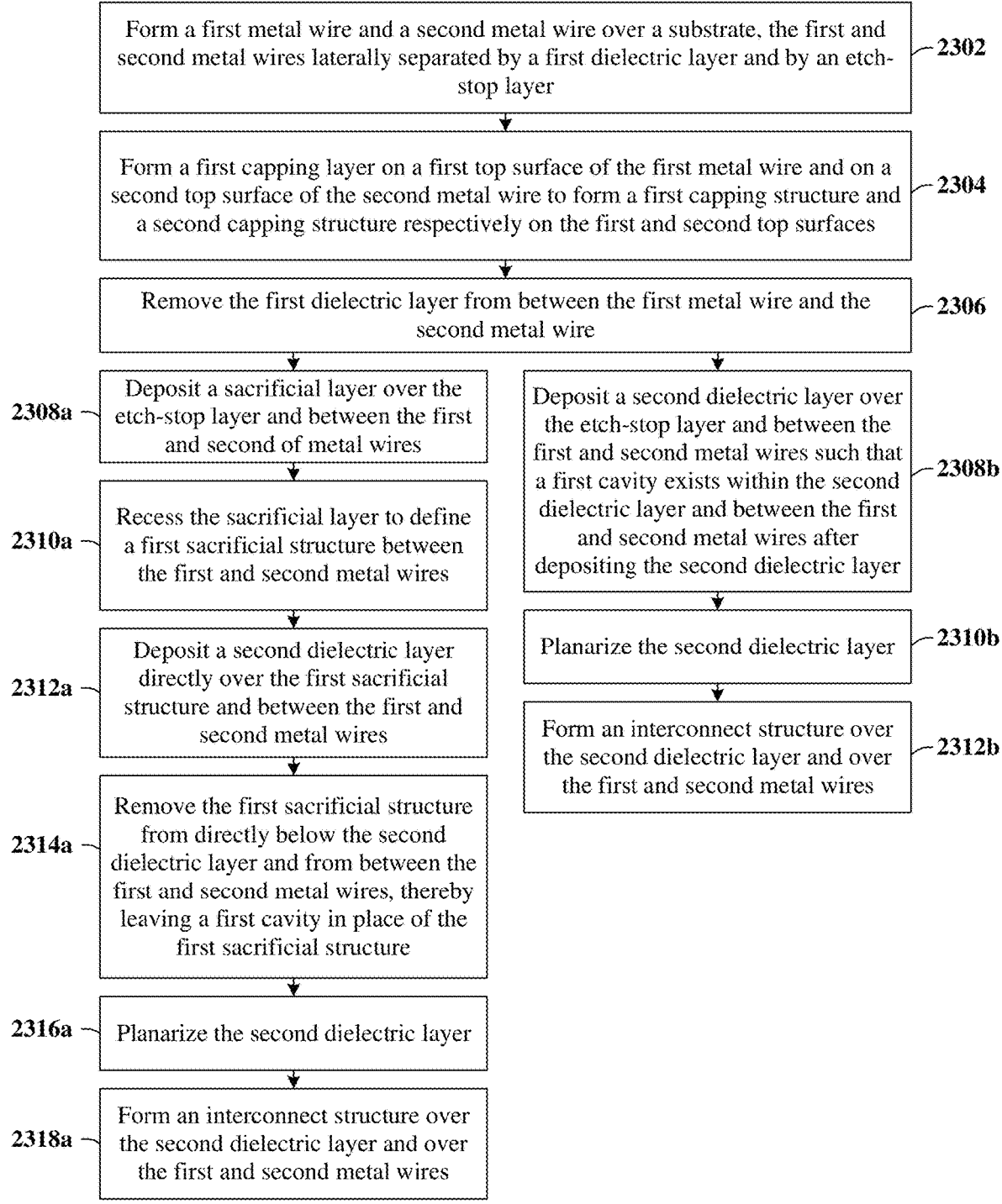
FIG. 23 illustrates a flow diagram of some embodiments of a method for forming an integrated chip comprising a first metal wire and a second metal wire that are laterally separated by a first cavity.

FIG. 23 illustrates a flow diagram of some embodiments of a method 2300 for forming an integrated chip comprising a first metal wire and a second metal wire that are laterally separated by a first cavity. While method 2300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2302, a first metal wire and a second metal wire are formed over a substrate. The first and second metal wires are laterally separated by a first dielectric layer and by an etch-stop layer. FIGS. 9 to 11 illustrate cross-sectional views 900-1100 of some embodiments corresponding to act 2302.

At 2304, a first capping layer is formed on a first top surface of the first metal wire and on a second top surface of the second metal wire to form a first capping structure and a second capping structure respectively on the first and second top surfaces. FIG. 12 illustrates a cross-sectional view 1200 of some embodiments corresponding to act 2304.

At 2306, the first dielectric layer is removed from between the first metal wire and the second metal wire. FIG. 13 illustrates a cross-sectional view 1300 of some embodiments corresponding to act 2306.

Acts 2308a, 2310a, 2312a, 2314a, 2316a, and 2318a illustrate a first embodiment for performing a remainder of the method 2300.

At 2308a, a sacrificial layer is deposited over the etch-stop layer and between the first and second of metal wires. FIG. 14 illustrates a cross-sectional view 1400 of some embodiments corresponding to act 2308a.

At 2310a, the sacrificial layer is recessed to define a first sacrificial structure between the first and second metal wires. FIG. 15 illustrates a cross-sectional view 1500 of some embodiments corresponding to act 2310a.

At 2312a, a second dielectric layer is deposited directly over the first sacrificial structure and between the first and second metal wires. FIG. 16 illustrates a cross-sectional view 1600 of some embodiments corresponding to act 2312a.

At 2314a, the first sacrificial structure is removed from directly below the second dielectric layer and from between the first and second metal wires, thereby leaving a first cavity in place of the first sacrificial structure. FIG. 17 illustrates a cross-sectional view 1700 of some embodiments corresponding to act 2314a.

At 2316a, the second dielectric layer is planarized. FIG. 18 illustrates a cross-sectional view 1800 of some embodiments corresponding to act 2316a.

At 2318a, an interconnect structure is formed over the second dielectric layer and over the first and second metal wires. FIG. 19 illustrates a cross-sectional view 1900 of some embodiments corresponding to act 2318a.

Acts 2308b, 2310b, and 2312b illustrate a second embodiment for performing the remainder of the method 2300.

At 2308b, a second dielectric layer is deposited over the etch-stop layer and between the first and second metal wires such that a first cavity exists within the second dielectric layer and between the first and second metal wires after depositing the second dielectric layer. FIG. 20 illustrates a cross-sectional view 2000 of some embodiments corresponding to act 2308b.

At 2310b, the second dielectric layer is planarized. FIG. 21 illustrates a cross-sectional view 2100 of some embodiments corresponding to act 2310b.

At 2312b, an interconnect structure is formed over the second dielectric layer and over the first and second metal wires. FIG. 22 illustrates a cross-sectional view 2200 of some embodiments corresponding to act 2312b.

Thus, the present disclosure relates to an integrated chip comprising one or more cavities for improving a performance of the integrate chip, and a method of forming the integrated chip for improving a reliability of the integrated chip.

Accordingly, in some embodiments, the present disclosure relates to an integrated chip comprising a substrate. A first conductive wire is over the substrate. A second conductive wire is over the substrate and is adjacent to the first conductive wire. A first dielectric cap is laterally between the first conductive wire and the second conductive wire. The first dielectric cap laterally separates the first conductive wire from the second conductive wire. The first dielectric cap comprises a first dielectric material. A first cavity is directly below the first dielectric cap and is laterally between the first conductive wire and the second conductive wire. The first cavity is defined by one or more surfaces of the first dielectric cap.

In other embodiments, the present disclosure relates to an integrated chip comprising a substrate. A first metal wire is over the substrate. A second metal wire is over the substrate and is laterally adjacent to the first metal wire. An etch-stop layer is over the substrate and is laterally between a first sidewall of the first metal wire and a second sidewall of the second metal wire. The etch-stop layer laterally separates the first sidewall from the second sidewall along bottoms of the first and second metal wires. A first dielectric cap is directly over the etch-stop layer and is laterally between the first sidewall of the first metal wire and the second sidewall of the second metal wire. The first dielectric cap laterally separates the first metal wire from the second metal wire along tops of the first and second metal wires. A first cavity is directly below the first dielectric cap and is directly over the etch-stop layer. The first cavity laterally separates the first sidewall of the first metal wire from the second sidewall of the second metal wire. The first cavity comprises a first gas. The first cavity is defined by one or more surfaces of the first dielectric cap. Further, the first sidewall of the first metal wire and the second sidewall of the second metal wire are devoid of nanoscopic voids.

In yet other embodiments, the present disclosure relates to a method for forming an integrated chip. The method comprises forming a first metal wire and a second metal wire over a substrate. The first metal wire and the second metal wire are laterally separated by a first dielectric structure. A capping layer is deposited on a first top surface of the first metal wire and a second top surface of the second metal wire at a faster rate than on a top surface of the first dielectric structure to form a first capping structure and a second capping structure respectively on the first and second top surfaces. A first etch is performed with the first capping structure and the second capping structure in place to remove the first dielectric structure from between the first metal wire and the second metal wire. The first etch removes the first dielectric structure at a faster rate than the first and second capping structures. A dielectric layer is formed between the first metal wire and the second metal wire. A first cavity is formed between the first and second metal wires after depositing the dielectric layer. The first cavity is defined by one or more surfaces of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
    forming a first metal wire and a second metal wire over a substrate, wherein the first metal wire and the second metal wire are laterally separated by a first dielectric structure;
    depositing a capping layer on a first top surface of the first metal wire and a second top surface of the second metal wire at a faster rate than on a top surface of the first dielectric structure to form a first capping structure and a second capping structure respectively on the first and second top surfaces;
    performing a first etch with the first capping structure and the second capping structure in place to remove the first dielectric structure from between the first metal wire and the second metal wire, wherein the first etch removes the first dielectric structure at a faster rate than the first and second capping structures;
    depositing a sacrificial layer over the first capping structure, over the second capping structure, and between the first metal wire and the second metal wire after performing the first etch;
    recessing the sacrificial layer from over the first capping structure and the second capping structure to below the first capping structure, the second capping structure, the first top surface, and the second top surface to form a first sacrificial structure between the first metal wire and the second metal wire;
    depositing a dielectric layer between the first metal wire and the second metal wire and directly over the first sacrificial structure after the recessing; and
    removing the first sacrificial structure from directly below the dielectric layer and from between the first and second metal wires, thereby leaving a first cavity in place of the first sacrificial structure, wherein the first cavity is formed between the first and second metal wires, and wherein the first cavity is defined by one or more surfaces of the dielectric layer.

2. The method of claim 1, wherein the first etch removes the first dielectric structure at a first rate and removes the first and second capping structures at a second rate, and wherein the first rate is greater than the second rate by a factor of 10 or more.

3. The method of claim 1, further comprising:
performing a planarization process on the dielectric layer, the first capping structure, and the second capping structure to remove the dielectric layer, the first capping structure, and the second capping structure from over the first metal wire and the second metal wire, wherein the dielectric layer is directly over the first cavity and directly between the first metal wire and the second metal wire after the planarization process is performed.

4. The method of claim 1, wherein the capping layer comprises a metal, and wherein the metal is selectively deposited on the first top surface of the first metal wire and on the second top surface of the second metal wire such that the top surface of the first dielectric structure is devoid of the metal after the capping layer is deposited.

5. The method of claim 1, wherein the first capping structure and the second capping structure remain over the first metal wire and the second metal wire, respectively, after the first etch.

6. The method of claim 1, wherein the first capping structure extends along the first top surface from a first sidewall of the first metal wire to a second sidewall of the first metal wire, wherein the second capping structure extends along the second top surface from a first sidewall of the second metal wire to a second sidewall of the second metal wire, wherein the first capping structure and the second capping structure are laterally spaced apart with a space therebetween before the first etch is performed, and wherein the space is delimited by a sidewall of the first capping structure, a sidewall of the second capping structure, and the top surface of the first dielectric structure.

7. The method of claim 1, wherein a pair of sidewalls of the first capping structure are directly over the first metal wire and extend from a top surface of the first capping structure to the first top surface of the first metal wire before the first etch is performed, and wherein a pair of sidewalls of the second capping structure are directly over the second metal wire and extend from a top surface of the second capping structure to the second top surface of the second metal wire before the first etch is performed.

8. The method of claim 1, wherein a sidewall of the second capping structure is directly over the first dielectric structure and extends from a top surface of the second capping structure to a top surface of the first dielectric structure.

9. The method of claim 8, wherein a portion of the first dielectric structure remains along a sidewall of the second metal wire after the first etch is performed.

10. The method of claim 9, wherein the dielectric layer is formed along a sidewall of the portion of the first dielectric structure after the first etch is performed, wherein the portion of the first dielectric structure is directly between the dielectric layer and the second metal wire, and wherein the portion of the first dielectric structure further defines the first cavity.

11. A method for forming an integrated chip, the method comprising:

forming a first metal wire and a second metal wire laterally spaced apart over a substrate, wherein a first dielectric layer is directly between the first metal wire and the second metal wire;

forming a first capping structure over the first metal wire and a second capping structure over the second metal wire, wherein the first capping structure and the second capping structure are laterally spaced apart, wherein the first dielectric layer is between the first capping structure and the second capping structure, and wherein a sidewall of the second capping structure is directly over the first dielectric layer and extends from a top surface of the second capping structure to a top surface of the first dielectric layer;

removing the first dielectric layer from directly between the first metal wire and the second metal wire with the first capping structure and the second capping structure in place over the first metal wire and the second metal wire, respectively, wherein a portion of the first dielectric layer remains along a sidewall of the second metal wire after the removing;

depositing a second dielectric layer between the first metal wire and the second metal wire, wherein a first cavity is formed between the first metal wire and the second metal wire; and removing the first capping structure and the second capping structure from over the first metal wire and the second metal wire after the depositing of the second dielectric layer.

12. The method of claim 11, wherein forming the first capping structure and the second capping structure comprises selectively depositing a capping layer over the first metal wire and the second metal wire.

13. The method of claim 12, wherein the capping layer is deposited on the first metal wire and the second metal wire at a first rate, wherein the capping layer is deposited on the first dielectric layer at a second rate, and wherein the first rate is greater than the second rate.

14. The method of claim 12, wherein the selectively depositing the capping layer over the first metal wire and the second metal wire comprises forming a blocking layer on a top surface of the first dielectric layer and depositing the capping layer with the blocking layer in place.

15. The method of claim 11, wherein removing the first dielectric layer from directly between the first metal wire and the second metal wire comprises etching the first dielectric layer, wherein the etching removes the first dielectric layer at a first rate, wherein the etching removes the first capping structure and the second capping structure at a second rate, and wherein the first rate is greater than the second rate.

16. The method of claim 11, further comprising:
depositing a sacrificial layer over the first capping structure, over the second capping structure, and directly between the first metal wire and the second metal wire;
recessing the sacrificial layer from over the first capping structure and the second capping structure to below a top surface of the first capping structure, a top surface of the second capping structure, a top surface of the first metal wire, and a top surface of the second metal wire with the first and second capping structures in place to form a sacrificial structure between the first metal wire and the second metal wire, wherein the second dielectric layer is deposited over the sacrificial structure and between the first metal wire and the second metal wire; and removing the sacrificial structure from between the first metal wire and the second metal wire and from under the second dielectric layer to form the first cavity between the first metal wire and the second metal wire and under the second dielectric layer, wherein a lower surface of the second dielectric layer delimits a top of the first cavity, and wherein the lower surface extends from a sidewall of the first metal wire to a sidewall of the portion of the first dielectric layer.

17. The method of claim 11, wherein the portion of the first dielectric layer covers the sidewall of the second metal wire, wherein the second dielectric layer is deposited directly between the first metal wire and the portion of the first dielectric layer, and wherein the portion of the first dielectric layer partially delimits the first cavity.

18. A method for forming an integrated chip, the method comprising:

forming a first metal wire and a second metal wire over a substrate, wherein the first metal wire and the second metal wire are laterally spaced apart, and wherein a first dielectric layer is directly between the first metal wire and the second metal wire;

selectively depositing a capping layer over the first metal wire and the second metal wire so that a top surface of the first metal wire and a top surface of the second metal wire are covered by the capping layer and a top surface of the first dielectric layer is uncovered, wherein the first dielectric layer is between a first sidewall of the capping layer and a second sidewall of the capping layer;

etching the uncovered top surface of the first dielectric layer with the capping layer in place to remove the first dielectric layer from between the first metal wire and the second metal wire;

depositing a sacrificial layer over the capping layer and directly between the first metal wire and the second metal wire;

recessing the sacrificial layer from over the capping layer to below the capping layer, below the top surface of the first metal wire, and below the top surface of the second metal wire to form a recessed sacrificial layer between the first metal wire and the second metal wire;

depositing a second dielectric layer between the first metal wire and the second metal wire and over the recessed sacrificial layer; and removing the recessed sacrificial layer from between the first metal wire and the second metal wire and from under the second dielectric layer to form a cavity between the first metal wire and the second metal wire, wherein the cavity is delimited by a surface of the second dielectric layer.

19. The method of claim 18, wherein a portion of the recessed sacrificial layer remains between the first metal wire and the second metal wire after the removing of the recessed sacrificial layer, and wherein the portion of the recessed sacrificial layer further delimits the cavity.

20. The method of claim 19, wherein the portion of the recessed sacrificial layer comprises carbon and extends along a sidewall of the first metal wire and a sidewall of the second metal wire, and wherein the second dielectric layer is on the portion of the recessed sacrificial layer.

* * * * *